United States Patent
Moriguchi et al.

(10) Patent No.: US 7,233,143 B2
(45) Date of Patent: Jun. 19, 2007

(54) BRORC-S2PD

(75) Inventors: Hisamoto Moriguchi, Cleveland, OH (US); Jonathan S. Lewin, Baltimore, MD (US); Jeffrey L. Duerk, Avon Lake, OH (US)

(73) Assignee: Case Western Reserve University, Cleveland, OH (US)

( * ) Notice: Subject to any disclaimer, the term of this patent is extended or adjusted under 35 U.S.C. 154(b) by 47 days.

(21) Appl. No.: 11/058,517

(22) Filed: Feb. 15, 2005

(65) Prior Publication Data
US 2006/0181275 A1 Aug. 17, 2006

(51) Int. Cl.
*G01V 3/00* (2006.01)
(52) U.S. Cl. ...................... 324/307; 324/309
(58) Field of Classification Search ............... 324/307, 324/309
See application file for complete search history.

(56) References Cited

U.S. PATENT DOCUMENTS 7,042,215 B2 * 5/2006 Moriguchi et al. ......... 324/307

2005/0017717 A1 * 1/2005 Duerk et al. ................ 324/307
2005/0033153 A1 * 2/2005 Moriguchi et al. ......... 600/410

OTHER PUBLICATIONS

Moriguchi et al., Block Regional Off-Resonance Correction (BRORC): A Fast and Effec. Deblurring Method for Spiral Imaging; Magnetic Res. in Med. 50:643-648 (2003).

Moriguchi et al., Dixon Techniques in Spiral Trajectories With Off-Resonance Correction . . . Magnetic Res. in Med. 50:915-924 (2003).

Moriguchi et al., A Fast Spiral Two-Point Dixon (Spiral 2PD) (2003) Technique Using Block Regional Off-Resonance Correction (BRORC).

* cited by examiner

*Primary Examiner*—Louis M. Arana
(74) *Attorney, Agent, or Firm*—McDonald Hopkins LLC

(57) ABSTRACT

Systems, methodologies, media, and other embodiments associated with a block-by-block off-resonance frequency estimation method are described. One exemplary method embodiment includes calculating a field map from local $B_0$ off resonance frequency estimates. The example method may also include performing water-fat decomposition and signal de-blurring based on the calculated map.

17 Claims, 17 Drawing Sheets

700

710

720

BRORC-S2PD

FEDERAL FUNDING NOTICE

This invention was made with government support under NIH Grants R01 CA81431 and R33 CA88144. The Federal Government has certain rights in the invention.

COPYRIGHT NOTICE

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND

Spiral imaging is a popular fast MRI (Magnetic Resonance Imaging) data acquisition strategy. Flow artifacts are usually not apparent in images reconstructed using spiral techniques due to inherently nulled gradient moments of the spiral trajectories. However, off-resonance effects may lead to blurring artifacts in spiral imaging. Additionally, specific blurring artifacts due to fat spins may be difficult to correct using conventional spiral off-resonance correction methods.

Spiral Dixon techniques using conventional spatially selective RF (radio frequency) pulses may be based on conventional Dixon techniques in rectilinear acquisitions. These spiral Dixon techniques may achieve unambiguous water-fat signal separation with effective blurring artifact correction, even in the presence of $B_0$ inhomogeneity. In Spiral three-point Dixon (S3PD) techniques, a frequency field map can be generated using methods analogous to rectilinear three point Dixon (3PD) techniques since off-resonance blurred signals do not affect the phase difference between the first and third data sets. De-blurred images may then be reconstructed using the frequency field map. However, three point spiral techniques may be computationally intensive. Thus two point techniques may be employed.

Spiral two-point Dixon (S2PD) techniques may be employed to facilitate unambiguous water-fat decomposition in spiral imaging with fewer computations than S3PD techniques. S2PD techniques may also facilitate correcting for off-resonance blurring artifacts using only two data sets. S2PD techniques may acquire the two data sets with different TEs (echo times). However, direct computation of a frequency field map in S2PD techniques may be complicated by the phase relationship between water and fat spins being disrupted by off-resonance blurred signals. Thus, to achieve both water-fat decomposition and signal de-blurring, off-resonance correction at multiple predetermined frequencies may be required in these conventional techniques. For example, in an S2PD technique that employs multi-frequency testing, several predetermined off-resonance frequencies may be tested to facilitate separating water and fat signals and de-blurring the decomposed images. However, the range of tested frequencies must be large enough to span a full range of anticipated $B_0$ variations, and thus S2PD techniques may also be computationally intensive.

Block regional off-resonance correction (BRORC) techniques may also be employed to facilitate correcting for off-resonance blurring artifacts in conventional spiral acquisitions. BRORC has been used with spiral acquisitions using spatial-spectral RF pulses (SPSP pulses). In BRORC, off-resonance correction proceeds block-by-block through a reconstructed image under the assumption that each small sub-image block has a constant $B_0$ off-resonance frequency. This assumption is valid in most cases since magnetic field inhomogeneities are usually smoothly varying across a field-of-view (FOV). BRORC is typically several times more computationally efficient than the conventional frequency-segmented off-resonance correction with no perceptual difference between the images.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
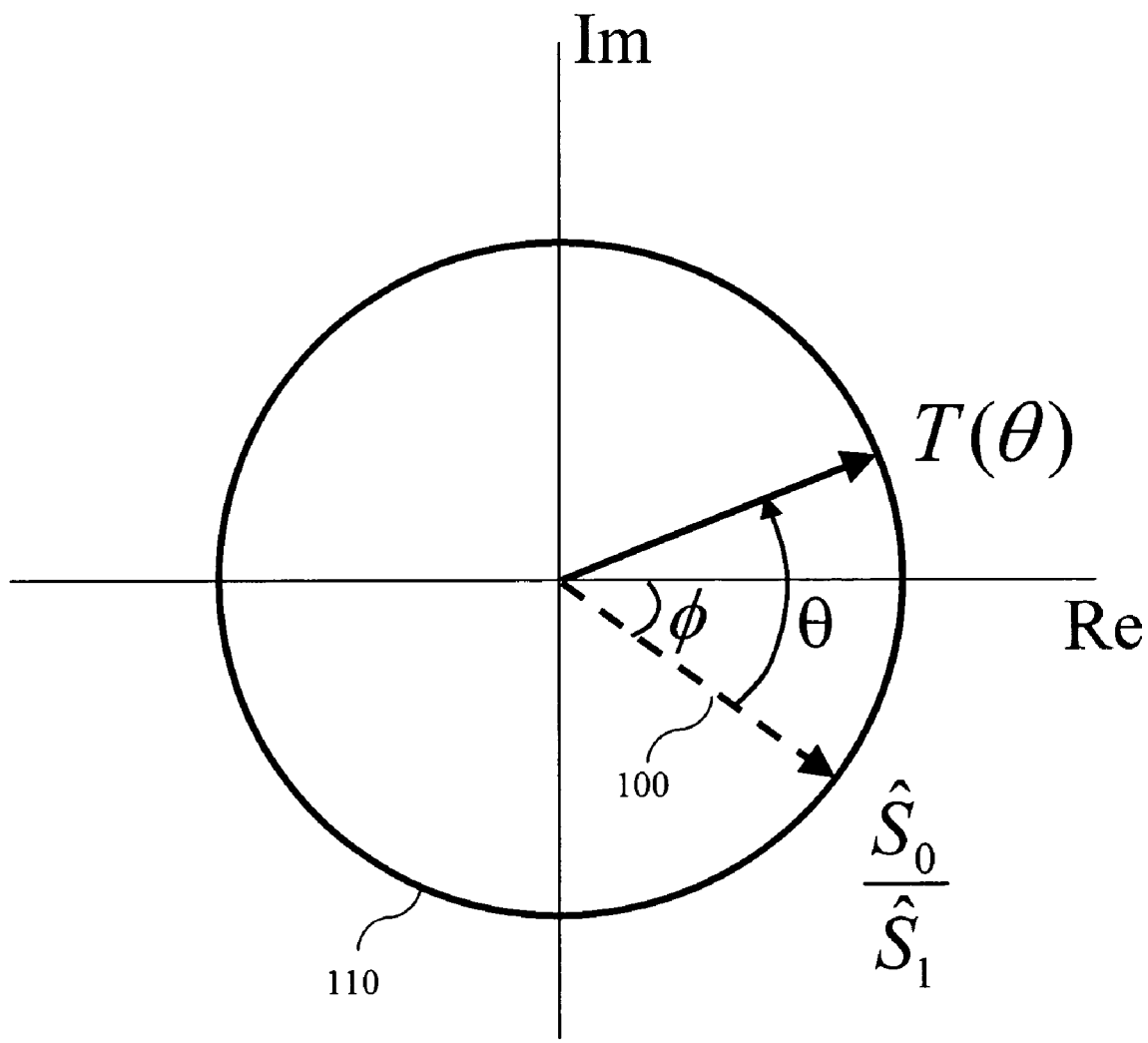
FIG. 1 illustrates an example relationship between $T(\theta)$, $\dfrac{\hat{S}_0}{\hat{S}_1}$ and $\phi$ in a BRORC-S2PD technique.

Example systems and methods described herein employ a BRORC-S2PD (block regional off-resonance correction, spiral two point Dixon) technique to estimate local $B_0$ off-resonance frequencies in a $B_0$ field produced by an MRI apparatus and to produce a map of those estimated $B_0$ off resonance frequencies. The estimated $B_0$ off-resonance frequency field map may then facilitate performing both water-fat decomposition and blurring artifact correction in a block-by-block manner. The example block-by-block approaches produce improvements in computational efficiency over conventional S2PD algorithms.

In BRORC-S2PD techniques, a local $B_0$ inhomogeneity in a $B_0$ field present when an MRI image is acquired is estimated on a block-by-block basis in the image domain. This block-by-block approach eliminates the need for multi-frequency testing and thus reduces computational complexity and intensity. In one example, both frequency estimation and off-resonance artifact correction proceed block-by-block through a reconstructed image.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Computer-readable medium", as used herein, refers to a medium that participates in directly or indirectly providing signals, instructions and/or data. A computer-readable medium may take forms, including, but not limited to, non-volatile media, volatile media, and transmission media. Non-volatile media may include, for example, optical or magnetic disks, and so on. Volatile media may include, for example, optical or magnetic disks, dynamic memory and the like. Transmission media may include coaxial cables, copper wire, fiber optic cables, and the like. Transmission media can also take the form of electromagnetic radiation, like that generated during radio-wave and infra-red data communications, or take the form of one or more groups of signals. Common forms of a computer-readable medium include, but are not limited to, a floppy disk, a flexible disk, a hard disk, a magnetic tape, other magnetic media, a CD-ROM, other optical media, punch cards, paper tape, other physical media with patterns of holes, a RAM, a ROM, an EPROM, a FLASH-EPROM, or other memory chip or card, a memory stick, a carrier wave/pulse, and other media from which a computer, a processor or other electronic device can read. Signals used to propagate instructions or other software over a network, like the Internet, can be considered a "computer-readable medium."

"Data store", as used herein, refers to a physical and/or logical entity that can store data. A data store may be, for example, a database, a table, a file, a list, a queue, a heap, a memory, a register, and so on. A data store may reside in one logical and/or physical entity and/or may be distributed between two or more logical and/or physical entities.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like an application specific integrated circuit (ASIC), a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical and/or physical communication channels can be used to create an operable connection.

"Software", as used herein, includes but is not limited to, one or more computer or processor instructions that can be read, interpreted, compiled, and/or executed and that cause a computer, processor, or other electronic device to perform functions, actions and/or behave in a desired manner. The instructions may be embodied in various forms like routines, algorithms, modules, methods, threads, and/or programs including separate applications or code from dynamically and/or statically linked libraries. Software may also be implemented in a variety of executable and/or loadable forms including, but not limited to, a stand-alone program, a function call (local and/or remote), a servelet, an applet, instructions stored in a memory, part of an operating system or other types of executable instructions. It will be appreciated by one of ordinary skill in the art that the form of software may depend, for example, on requirements of a desired application, the environment in which it runs, and/or the desires of a designer/programmer or the like. It will also be appreciated that computer-readable and/or executable instructions can be located in one logic and/or distributed between two or more communicating, co-operating, and/or parallel processing logics and thus can be loaded and/or executed in serial, parallel, massively parallel and other manners.

Suitable software for implementing the various components of the example systems and methods described herein may be produced using programming languages and tools like Java, Pascal, C#, C++, C, CGI, Perl, SQL, APIs, SDKs, assembly, firmware, microcode, and/or other languages and tools. Software, whether an entire system or a component of a system, may be embodied as an article of manufacture and maintained or provided as part of a computer-readable medium as defined previously. Another form of the software may include signals that transmit program code of the software to a recipient over a network or other communication medium. Thus, in one example, a computer-readable medium has a form of signals that represent the software/firmware as it is downloaded from a web server to a user. In another example, the computer-readable medium has a form of the software/firmware as it is maintained on the web server. Other forms may also be used.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

In an S2PD technique, two reconstructed images ($S_0$ and $S_1$) may be acquired using normal spatially selective RF pulses in pulse sequence repetitions. The TEs (echo times) of $S_0$ and $S_1$ are set to $n\tau$ and $(n+1)\tau$, respectively, where n is a positive integer and $\tau$ is the time during which fat spins precess 180° out of phase with respect to water spins. With this condition, the signals at each pixel in the reconstructed images ($S_0$ and $S_1$) can be expressed as:

$$S_0 = W' + F' \qquad [\text{Equation 1}]$$

$$S_1 = (W' - F')\exp(i\phi) \qquad [\text{Equation 2}]$$

where W' is a water signal blurred by a local $B_0$ inhomogeneity off-resonance frequency f (Hz), F' is a fat signal blurred by the local $B_0$ inhomogeneity and a chemical-shift off-resonance frequencies $f + f_{fat}$ (Hz), and $\phi$ is the phase shift due to the $B_0$ inhomogeneity off-resonance effects during $\tau$. That is, $$\phi = 2\pi f \tau \qquad [\text{Equation 3}]$$

Figure 2:
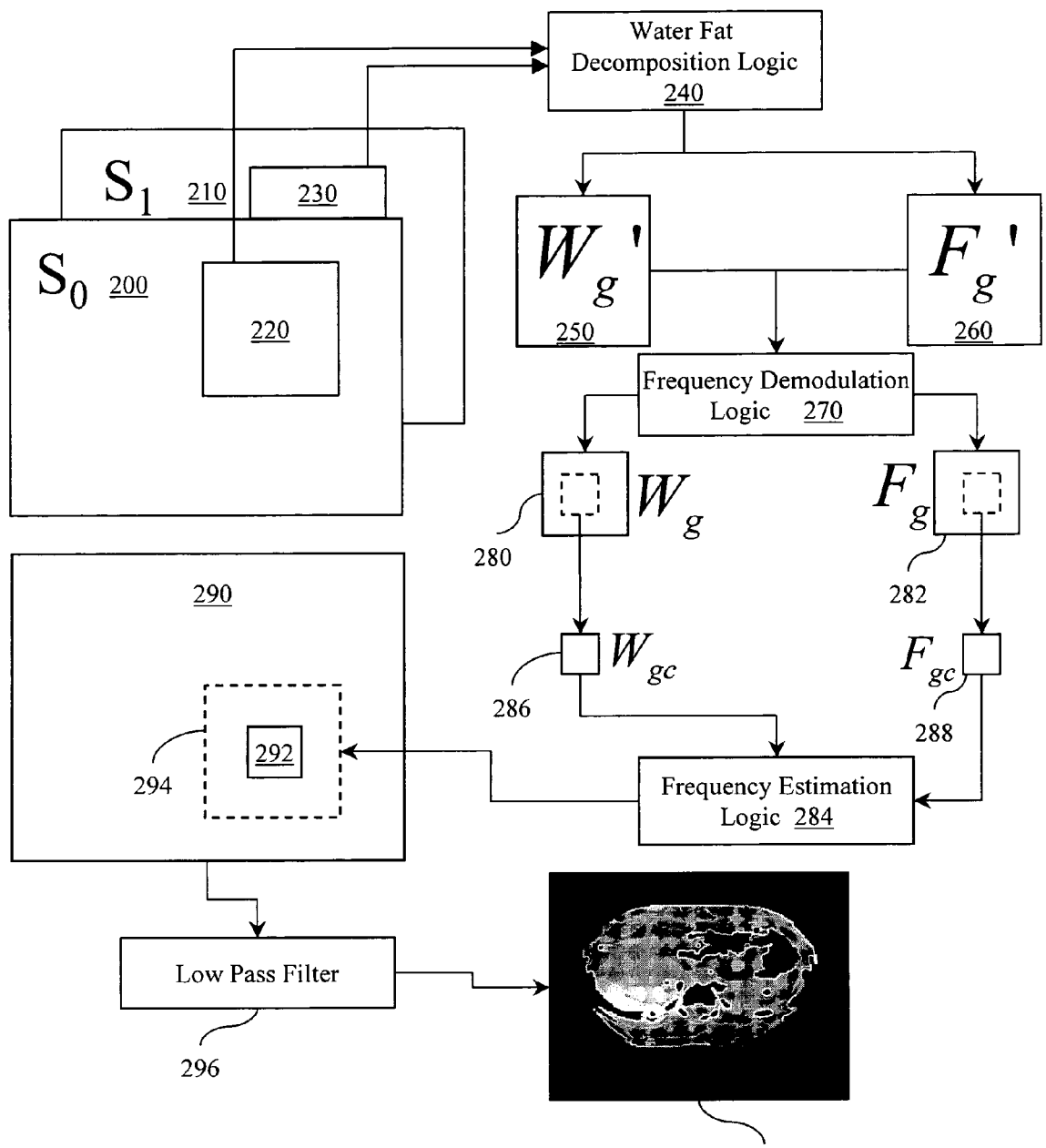
FIG. 2 illustrates a processing flow associated with building an estimated $B_0$ off-resonance frequency field map using a block-based frequency estimation method and an example BRORC-S2PD technique.
Figure 5:
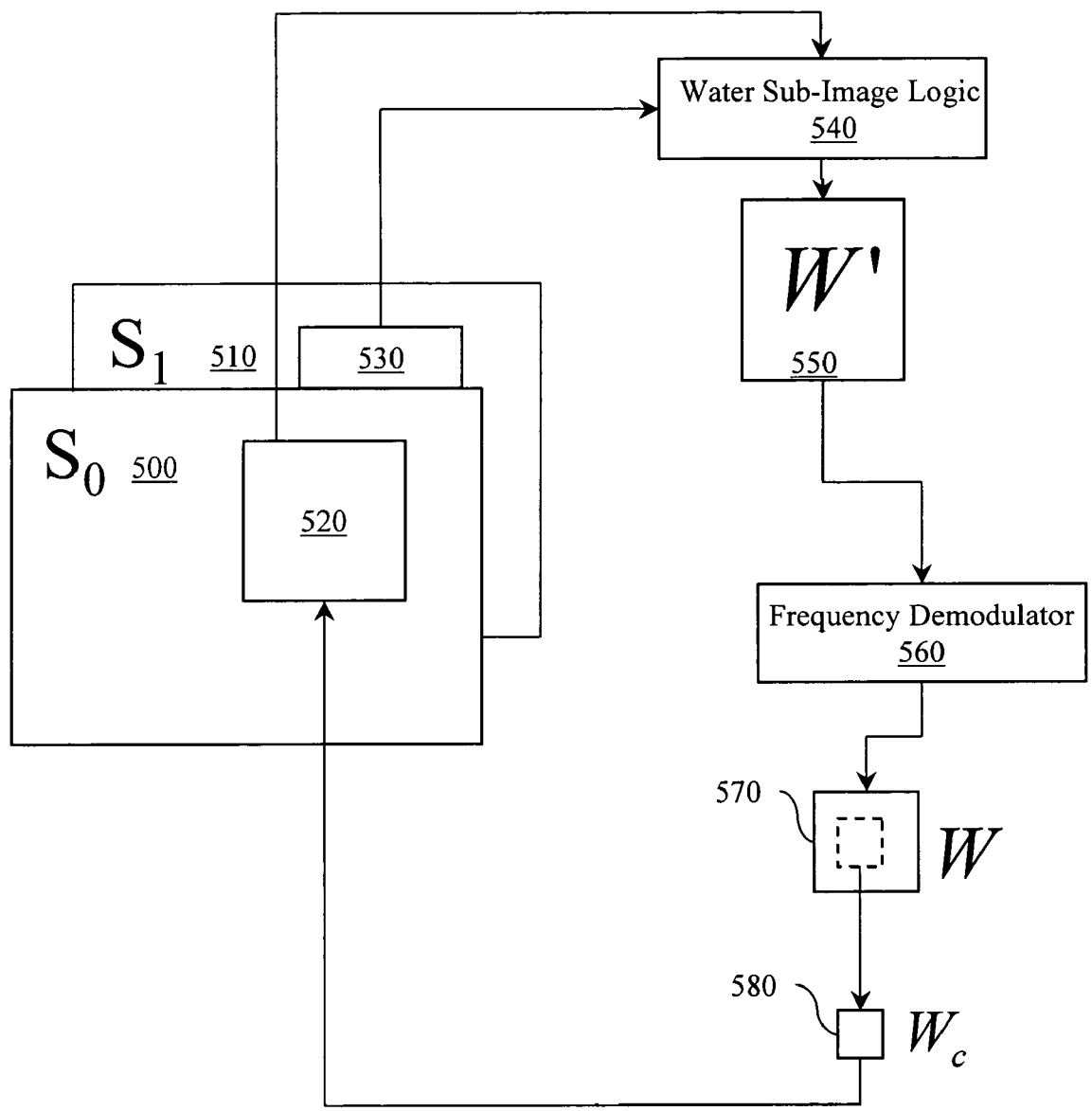
FIG. 5 illustrates an example processing flow associated with an example BRORC-S2PD based water image reconstruction method.

$S_0$ and $S_1$ will be used through the description and the claims in this application to refer to the two reconstructed images acquired using the above-described MRI acquisition parameters. One example BRORC-S2PD technique includes two steps. First, as illustrated in FIG. 2, a local $B_0$ off-resonance frequency estimation is performed repeatedly to form a field map of estimated $B_0$ off-resonance frequencies. Then, as illustrated in FIG. 5, water-fat decomposition and signal de-blurring are performed using the field map produced in the first phase. In both actions, operations may be performed block-by-block through a reconstructed image.

$B_0$ off-resonance frequency estimation may be performed efficiently using a block-based approach. If blurring artifacts are negligible in data sets acquired using an S2PD technique, then idealized signals in $S_0$ and $S_1$ may be defined as $\hat{S}_0$ and $\hat{S}_1$. In this case, Equations 1 and 2 may be rewritten as:

$$\hat{S}_0 = W + F \qquad [\text{Equation 4}]$$

$$\hat{S}_1 = (W - F)\exp(i\phi) \qquad [\text{Equation 5}]$$

where W and F are water and fat signals free of blurring artifacts. Now consider a function $T(\theta)$:

$$T(\theta) = \frac{\hat{S}_0}{\hat{S}_1} \cdot \exp(i\theta) \qquad [\text{Equation 6}]$$

From this definition, $T(\theta)$ is a periodic function of $\theta$ with a period $2\pi$. $T(\theta)$, when used in the description and claims in this application will refer to this periodic function of $\theta$. When $\theta = \phi$, Equation 7 follows:

$$T(\phi) = \frac{\hat{S}_0}{\hat{S}_1} \cdot \exp(i\phi) = \frac{W+F}{W-F} \qquad [\text{Equation 7}]$$

W and F may be aligned when n is even and may be opposed when n is odd. In either case, Equation 7 yields a real value.

FIG. 1 illustrates a relationship between $$T(\theta), \frac{\hat{S}_0}{\hat{S}_1}$$

and an angle $\phi$. Suppose that $$\frac{\hat{S}_0}{\hat{S}_1}$$

is a vector indicated by dashed arrow 100. Solid circle 110 represents all possible values that $T(\theta)$ can take. $T(\phi)$ is real. As indicated in FIG. 1, if $\theta$ is close to $\phi$, $\phi$ can be computed as:

$$\phi = \theta - \tan^{-1}\left(\frac{\text{Im}(T(\theta))}{\text{Re}(T(\theta))}\right) \qquad [\text{Equation 8}]$$

where Im( ) and Re( ) represent the imaginary and real parts of the quantities within the parentheses.

Equations 4 through 8 and the discussion associated therewith assume that the blurring artifacts of water and fat signals in $\hat{S}_0$ and $\hat{S}_1$ are negligible. However, in some examples, blurring artifacts cannot be ignored. A method to efficiently estimate a local $B_0$ frequency from the original blurred signals for sub-image regions is described below. This method may be employed on a block-by-block basis to facilitate producing a map that records local $B_0$ off-resonance frequency estimations.

FIG. 2 illustrates a processing flow for estimating a local $B_0$ off-resonance frequency in a block by block manner in the image domain. The processing flow begins by accessing $S_0$ 200 and $S_1$ 210. In one example, the original image matrix size for $S_0$ 200 and $S_1$ 210 may be N×N (e.g., N=256). Sub-image $M_1 \times M_1$ matrices 220 and 230 are extracted from corresponding locations in $S_0$ 200 and $S_1$ 210. $M_1$ may be, for example, a power of 2 (e.g., 16). Water-fat signal decomposition is performed for the extracted $M_1 \times M_1$ matrices 220 and 230 based on a guess frequency $f_g$. In one example, an original guess frequency $f_g$ may be zero. But if a guess frequency $f_g$ close to the true frequency f of a particular sub-image region is available, then water-fat decomposition may be performed by a water-fat decomposition logic 240 using:

$$W_g' = (S_0 + S_1 \exp(-i\phi_g))/2 \quad \text{[Equation 9], and}$$

$$F_g' = (S_0 - S_1 \exp(-i\phi_g))/2 \quad \text{[Equation 10], with}$$

$$\phi_g = 2\pi f_g \cdot \tau \quad \text{[Equation 11]}$$

where $W_g'$ 250 and $F_g'$ 260 are the decomposed water and fat $M_1 \times M_1$ sub-images. For subsequent sub-image matrices, the guess frequency may be based, at least in part, on an estimated frequency in a neighboring block(s).

Blurring artifacts in $W_g'$ 250 and $F_g'$ 260 may now be reduced by a frequency demodulation logic 270. To generate a de-blurred water image $W_g$ 280 from $W_g'$ 250, the frequency demodulation logic 270 may perform a 2D-FFT (Fast Fourier Transform) on $W_g'$ 250 to obtain Fourier data. The frequency demodulation logic 270 may perform frequency demodulation on the Fourier data with the frequency $f_g$. Although it is possible to demodulate an entire $M_1 \times M_1$ Fourier data, frequency demodulation may also be performed on lower-frequency components like a central $m_1 \times m_1$ Fourier data matrix ($m_1 \leq M_1$) to reduce computational costs. In one example, high resolution sub-images are not employed since the process flow illustrated in FIG. 2 seeks to estimate a correct local $B_0$ frequency from a phase difference between the water and fat sub-images. The frequency demodulation logic 270 may then perform a 2D-IFFT (inverse FFT) on the demodulated $m_1 \times m_1$ Fourier data matrix to reconstruct a water sub-image $W_g$ 280. While an FFT and an IFFT are described, it is to be appreciated that in some examples the frequency demodulation logic 270 may perform other Fourier transforms and inverse Fourier transforms.

A de-blurred fat sub-image $F_g$ 282 can be reconstructed from $F_g'$ 260 using the same procedures as described above but with the demodulation frequency $f_g + f_{fat}$. Local frequency estimation may then be performed by a frequency estimation logic 284.

Central matrices $W_{gc}$ 286 and $F_{gc}$ 288 may be extracted from $W_g$ 280 and $F_g$ 282 to facilitate avoiding artifacts in the outer regions of $W_g$ 280 and $F_g$ 282. The central matrices may be, for example, 2 pixels by 2 pixels in size. $T_{gc}$ may be computed by the frequency estimation logic 284 from $W_{gc}$ 286 and $F_{gc}$ 288 using:

$$T_{gc} = \overline{\left(\frac{W_{gc} + F_{gc}}{W_{gc} - F_{gc}}\right)} \quad \text{[Equation 12]}$$

In Equation 12, element-by-element division is performed within the parentheses, and the bar denotes the average of the elements of the matrix in the parentheses. If $f_g$ is close to the true $B_0$ off-resonance frequency f, then the off-resonance blurring artifacts contained in $W_{gc}$ 286 and $F_{gc}$ 288 may be insignificant. Therefore $T_{gc}$ in Equation 12 is approximately equal to $T(\phi_g)$:

$$T_{gc} \cong T(\phi_g) \quad \text{[Equation 13]}$$

Thus, the first actual estimate of the local $B_0$ off-resonance frequency $f_e$, may be determined by the frequency estimation logic 284 using:

$$f_e = f_g - f_d \quad \text{[Equation 14], with}$$

$$f_d = \frac{\tan^{-1}\left(\frac{\text{Im}(T_{gc})}{\text{Re}(T_{gc})}\right)}{2\pi \cdot \tau} \quad \text{[Equation 15]}$$

That is, $f_d$ is an estimate of the difference between the original guess frequency $f_g$ and the true local off-resonance frequency f. Thus, Equations 14 and 15 may be viewed as a re-evaluation of Equation 8 with a conversion from phase to frequency. Frequency estimation errors may then be reduced. the frequency estimation logic 284 by setting the computed off-resonance frequency $f_e$ in a location in the field map 290 associated with the sub-images $S_0$ 220 and $S_1$ 230 to the central $r_1 M_1 \times r_1 M_1$ pixels 292 of the $M_1 \times M_1$ matrix region 294. A final estimated $B_0$ off-resonance frequency field map 298 may then be created by applying a low pass filter 296 to the initial estimated field map 290.

The value of $f_e$ given by Equations 14 and 15 may be relatively accurate if the region corresponding to $W_{gc}$ 286 and/or $F_{gc}$ 288 contains either predominantly water or fat tissue. However, frequency estimation may be unstable for voxels containing nearly equal water and fat signals. Therefore, a regularization function R may be introduced into Equation 14:

$$f_e = f_g - R \cdot f_d \quad \text{[Equation 16]}$$

Figure 3:
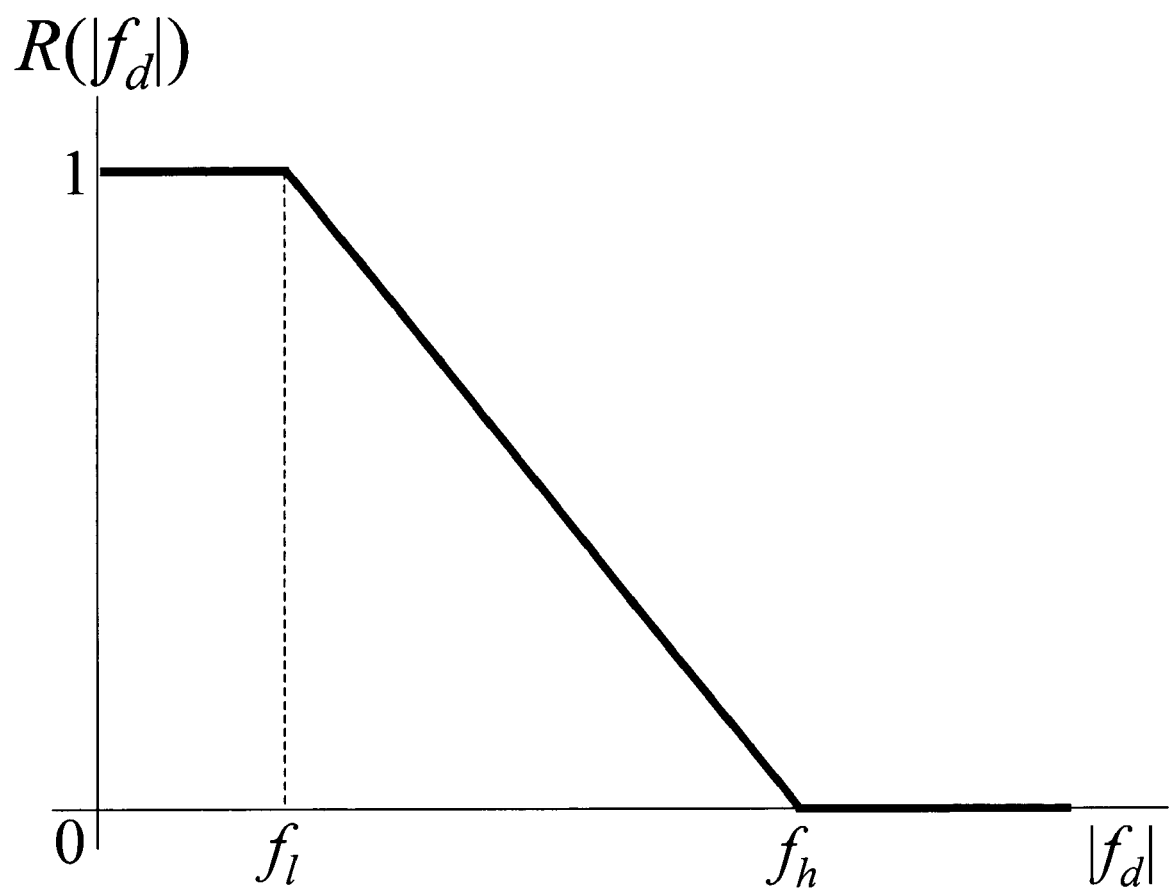
FIG. 3 illustrates an example regularization function R used in association with building an estimated $B_0$ off-resonance frequency field map associated with an example BRORC-S2PD technique.

An example function R is illustrated in FIG. 3. The frequency estimation logic 284 may apply the regularization function to refine $f_e$. In the example illustrated in FIG. 3, R is a function of the absolute value of $f_d$. In FIG. 3, $f_l$ and $f_h$ are predetermined low and high frequency thresholds. The regularization function R may be based on an assumption that the true $B_0$ frequency f is close to the initial guess, $f_g$. In FIG. 3, the abscissa denotes the absolute value of $f_d$ given by Equation 15. This regularization function is based on the assumption that $|f - f_g|$ is small when $f_g$ is set to the average frequency of the neighboring frequency-estimated blocks. While one example regularization function R is illustrated, it is to be appreciated that other regularization functions may be employed.

As shown in FIG. 2, in map 290, the central $r_1 M_1 \times r_1 M_1$ pixels 292 (0<$r_1 \leq 1$) of the $M_1 \times M_1$ matrix 294 are set to $f_e$ following the calculation of Equation 16. $B_0$ frequencies for an entire image region or for a specific region(s) of the image may then be estimated by repeating the above described actions.

Block-based region growing actions may be performed to facilitate providing an estimated frequency for the guess frequency used in subsequent repetitions. By way of illustration, a $B_0$ frequency associated with a first $r_1 M_1 \times r_1 M_1$ block may be determined using Equations 14 and 15. An initial guess frequency $f_g$ may be supplied, for example, by a user. In the example, the $f_g$ may be a pure guess (e.g., 0 Hz) in the first evaluation of Equations 14 and 15. Then, Equations 14 and 15 may be re-evaluated after the output $f_e$ is set to $f_g$. This process may be repeated until $f_e$ becomes substantially constant. After the $B_0$ frequency is estimated for the first $r_1M_1 \times r_1M_1$ block, local $B_0$ frequencies of neighboring blocks may be estimated using Equation 16. The output $f_e$ of the frequency-determined block may then be used in subsequent calculations as the $f_g$ for frequency estimation of the neighboring blocks.

Figure 4:
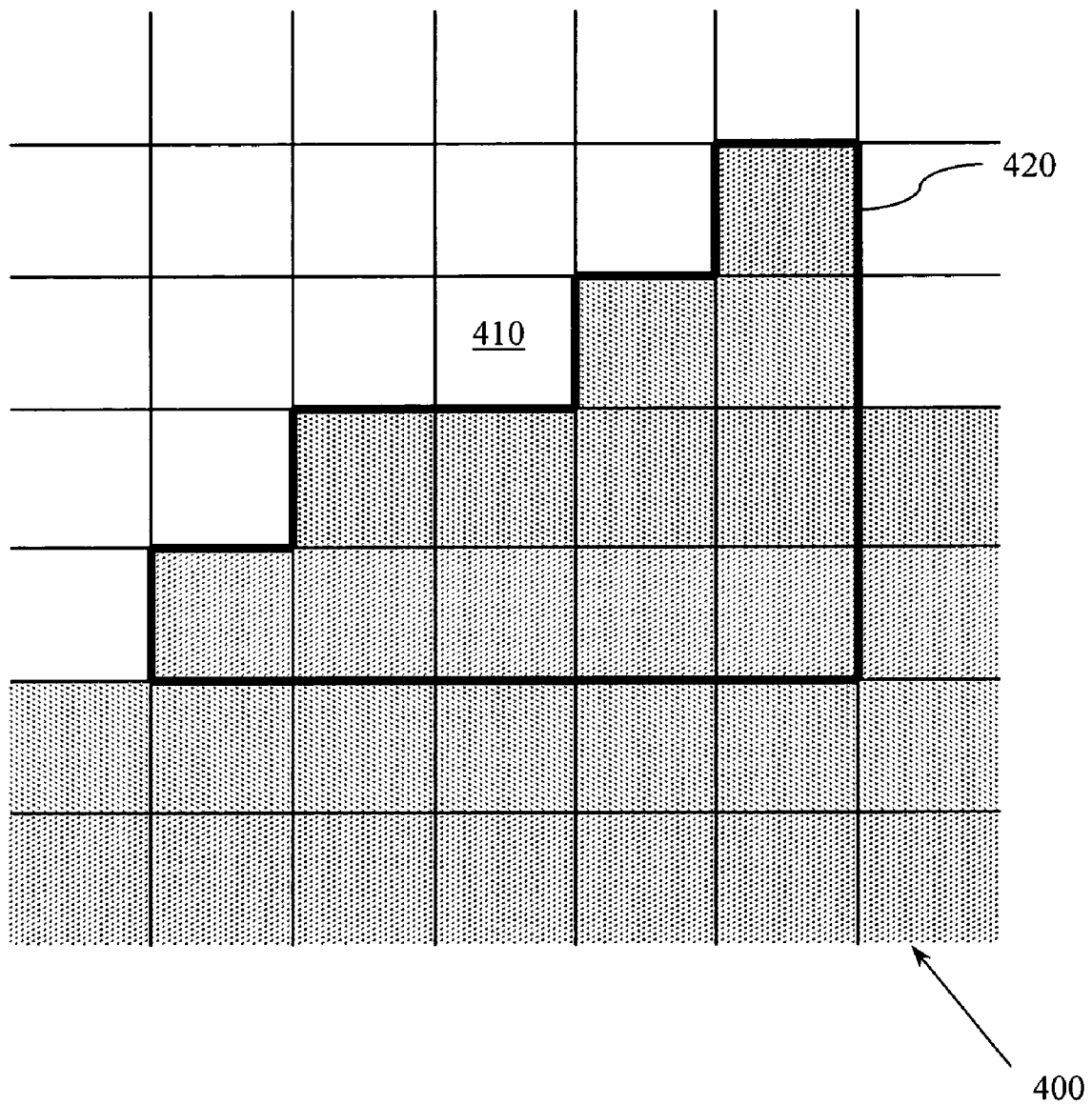
FIG. 4 illustrates example block-based region growing employed in $B_0$ off-resonance frequency estimation.

FIG. 4 illustrates an example block-based region growing technique that may be employed in $B_0$ off-resonance frequency estimation. In FIG. 4, squares represent $r_1M_1 \times r_1M_1$ blocks in a $B_0$ off-resonance frequency field map. A shaded area 400 represents a region for which local $B_0$ frequencies have already been estimated. Now consider that a resonant frequency for a block 410 is to be estimated. When Equation 16 is used for the frequency estimation of block 410, $f_g$ may be provided by taking the average static magnetic field frequency of neighboring blocks that have already been estimated (e.g., blocks in region 420). The frequency-estimated region 420 may then be expanded block by block, based on the initial guess determined from previous local estimates. In one example, the average static magnetic field frequency may be employed for determining $f_g$ in a region growing method. While an average static magnetic field frequency method is described, it is to be appreciated that other values may be employed in region growing methods. Similarly, while an example pattern of neighboring blocks is illustrated in FIG. 4, it is to be appreciated that other patterns and sets of blocks with previously estimated frequencies may be employed to compute a guess frequency for a block whose resonant frequency is about to be estimated.

A low pass filter 296 (FIG. 2) may be applied to the initial map 290 to facilitate avoiding large estimation errors for regions in $S_0$ 200 and $S_1$ 210 where water and fat signal intensities are nearly equal. The map 298 thus obtained may then be employed for water-fat decomposition and off-resonance blurring artifact correction as illustrated in FIG. 5.

FIG. 5 illustrates an example processing flow associated with an example BRORC-S2PD based water image reconstruction method. While water image reconstruction is illustrated, it is to be appreciated that fat image reconstruction may also occur using a similar processing flow. However, since water signals are generally more clinically interesting, water image reconstruction is illustrated.

As with the processing illustrated in FIG. 2, processing begins in FIG. 5 with $S_0$ 500 and $S_1$ 510. First, sub-image matrices 520 and 530 with a size $M_2 \times M_2$ are extracted from $S_0$ 500 and $S_1$ 510 at corresponding locations. $M_2$ may be, for example, a power of 2 (e.g., 32). In one example, $M_2$ does not need to be equal to $M_1$ (FIG. 2).

A water sub-image logic 540 may then separate water signals in the $M_2 \times M_2$ sub-image matrices to produce a separated sub-image W' 550. A frequency demodulator 560 may then demodulate the separated sub-image W' 550 to produce W 570. Both water signal separation and frequency demodulation may be performed for the extracted $M_2 \times M_2$ matrices based on the frequency $\bar{f}_e$. The separation of water signals and frequency demodulation are performed assuming that the region associated with the $M_2 \times M_2$ matrices has a constant $B_0$ off-resonance frequency $\bar{f}_e$. In one example, $\bar{f}_e$ is the mean $B_0$ off-resonance frequency of the central $r_2M_2 \times r_2M_2$ pixels ($0 < r_2 \leq 1$) in the $M_2 \times M_2$ matrices in the estimated $B_0$ off-resonance frequency field map. While the mean $B_0$ off-resonance frequency is described, it is to be appreciated that $\bar{f}_e$ may be selected in other manners. In one example, the water sub-image may be computed using:

$$W'=(S_0+S_1 \exp(-i\phi_e))/2 \quad \text{[Equation 17], where}$$

$$\phi_e=2\pi \bar{f}_e \tau \quad \text{[Equation 18].}$$

The water sub-image W' 550 may exhibit blurring artifacts. Therefore, de-blurring may be performed for sub-image W' 550. As described above, frequency demodulator 560 may frequency demodulate W' 550 to produce demodulated water-image data. Then, the de-blurred water sub-image W 570 is obtained when the frequency demodulator 560 performs a 2D-inverse Fourier transform on the demodulated water image data. Since the outer regions of W 570 may exhibit artifacts, in one example only the central $r_2M_2 \times r_2M_2$ pixels of W 570 are retained for insertion into a final reconstructed image. The flow illustrated in FIG. 5 may be repeated until an entire scanned object is processed. Alternatively, the flow illustrated in FIG. 5 may be repeated until a selected subsection of an entire scanned object is processed.

A fat image can also be reconstructed using procedures similar to those in FIG. 5. For a fat image, $S_0$ 500 and $S_1$ 510 are demodulated with the chemical shift frequency $f_{fat}$ to form $\tilde{S}_0$ and $\tilde{S}_1$. After $M_2 \times M_2$ matrices are extracted from $\tilde{S}_0$ and $\tilde{S}_1$, a fat-image can be computed using:

$$F'=(\tilde{S}_0 - \tilde{S}_1 \exp(-i\phi_e))/2 \quad \text{[Equation 19]}$$

As F' may exhibit blurring artifacts due to the local $B_0$ off-resonance frequency, F' may be demodulated with the frequency $\bar{f}_e$ to reconstruct a de-blurred sub-image F. Like the de-blurred water sub-image W 570, in some examples only the central $r_2M_2 \times r_2M_2$ pixels of F are retained for insertion into a final reconstructed image.

In one example, both the block-based frequency estimation method and the block-based signal decomposition and de-blurring method can be applied to specific regions of interest in $S_0$ and $S_1$ rather than to an entire image. This is not possible using conventional S2PD techniques.

Computational costs of the BRORC-S2PD techniques and S2PD techniques may be compared to illustrate improved computational efficiency. In one example, the total number of complex multiplications required for water image reconstruction using an example BRORC-S2PD technique can be expressed as:

$$BS_{2PD}(W)=(2 \cdot 2N^2 \log_2 N)+(s_1 \cdot 2(M_1^2+2M_1^2 \log_2 M_1 + m_1^2 + 2m_1^2 \log_2 m_1))+(s_2 \cdot (M_2^2+2M_2^2 \log_2 M_2 + M_2^2 + 2M_2^2 \log_2 M_2)) \quad \text{[Equation 20]}$$

where $s_1$ and $s_2$ are the total number of $r_1M_1 \times r_1M_1$ blocks and that of $r_2M_2 \times r_2M_2$ blocks, respectively, necessary to cover the scanned object regions. In Equation 20, the first, second, and third sections describe the number of complex multiplications required for the original image reconstruction (two N×N images with different TEs), those for frequency estimation, and those necessary for the water image reconstruction, respectively. The computational costs for other operations like those associated with Equations 12, 15, and 16 are ignored in Equation 20.

The total number of complex multiplications required for water image reconstruction in a conventional S2PD technique can be expressed as:

$$S_{2PD}(W)=L \cdot 2(N^2+N^2+2N^2 \log_2 N) \quad \text{[Equation 21]}$$

In Equation 21, the first, second and third terms within the parentheses express the number of complex multiplications required for signal decomposition, frequency-demodulation, and 2D-FFT on N×N k-space data, respectively, with a particular tested $B_0$ off-resonance frequency. The computational costs for other operations like those necessary for frequency determination, are ignored in Equation 21. The factor 2 before the parenthesis in Equation 21 results from the fact that water and fat images are simultaneously reconstructed in the S2PD technique.

Figure 6:
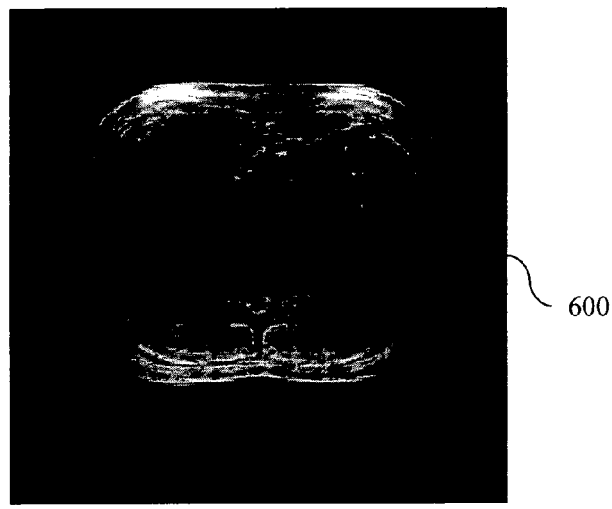
FIG. 6 illustrates three views of example abdominal MRI images.
Figure 6:
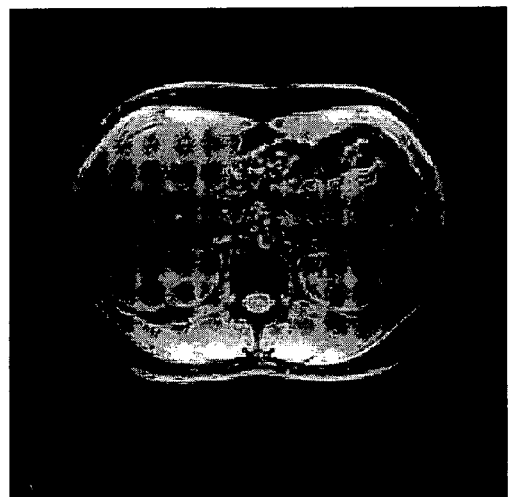
Figure 6:
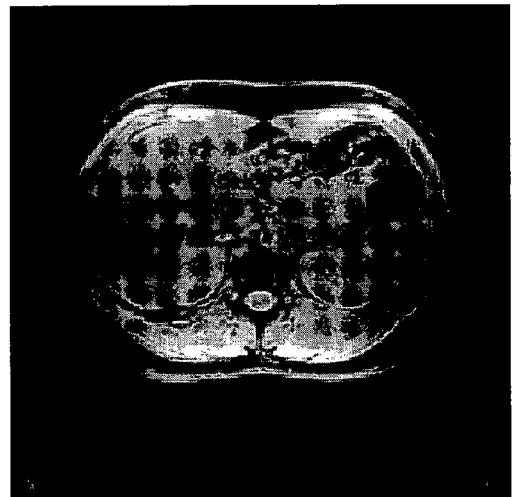

FIG. 6 illustrates an original reconstructed water image 600 with TE=4.4 ms, and a water image 610 reconstructed using an example S2PD technique with L=26, and a water image 620 reconstructed using an example BRORC-S2PD technique with $(M_1, m_1, r_1)=(16, 8, 0.25)$ and $(M_2, r_2)=(32, 0.5)$. Significant blurring artifacts are observed for the entire region in image 600. Images 610 and 620 illustrate that both the example S2PD technique and the example BRORC-S2PD technique perform effective fat signal suppression with off-resonance de-blurring.

Figure 7:
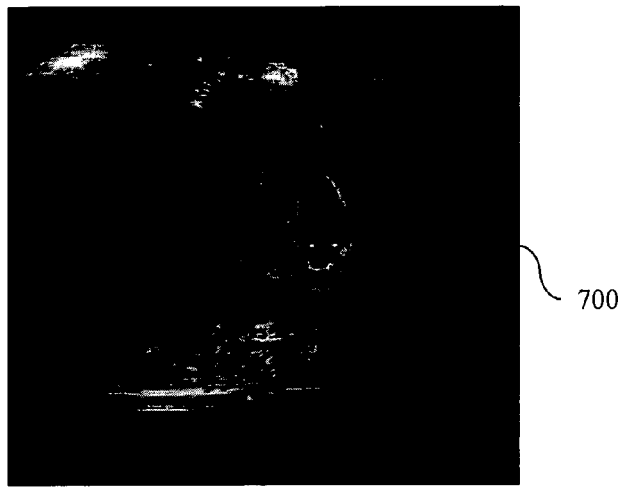
FIG. 7 illustrates three views of example cardiac MRI images.
Figure 7:
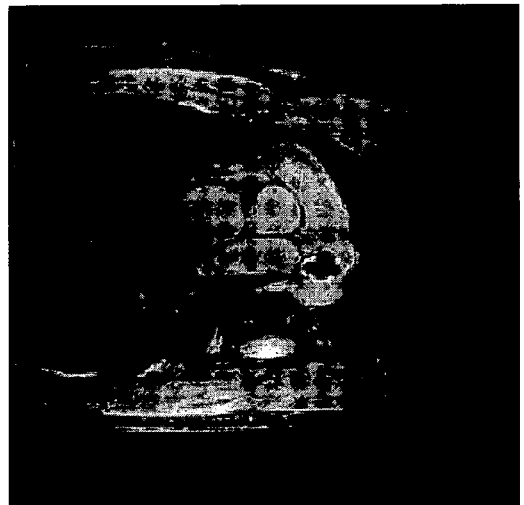
Figure 7:
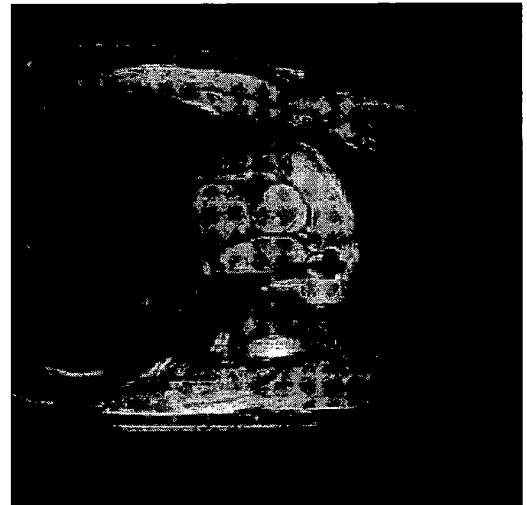

FIG. 7 illustrates an original reconstructed water image 700 with TE=4.4 ms and a water image 710 reconstructed using an example S2PD technique with L=29, and a water image 720 reconstructed using an example BRORC-S2PD technique with $(M_1, m_1, r_1)=(16, 8, 0.25)$ and $(M_2, r_2)=(32, 0.5)$. Effective fat signal suppression and blurring artifact correction are achieved in the example S2PD technique and BRORC-S2PD technique when compared with the original image 700.

Figure 8:
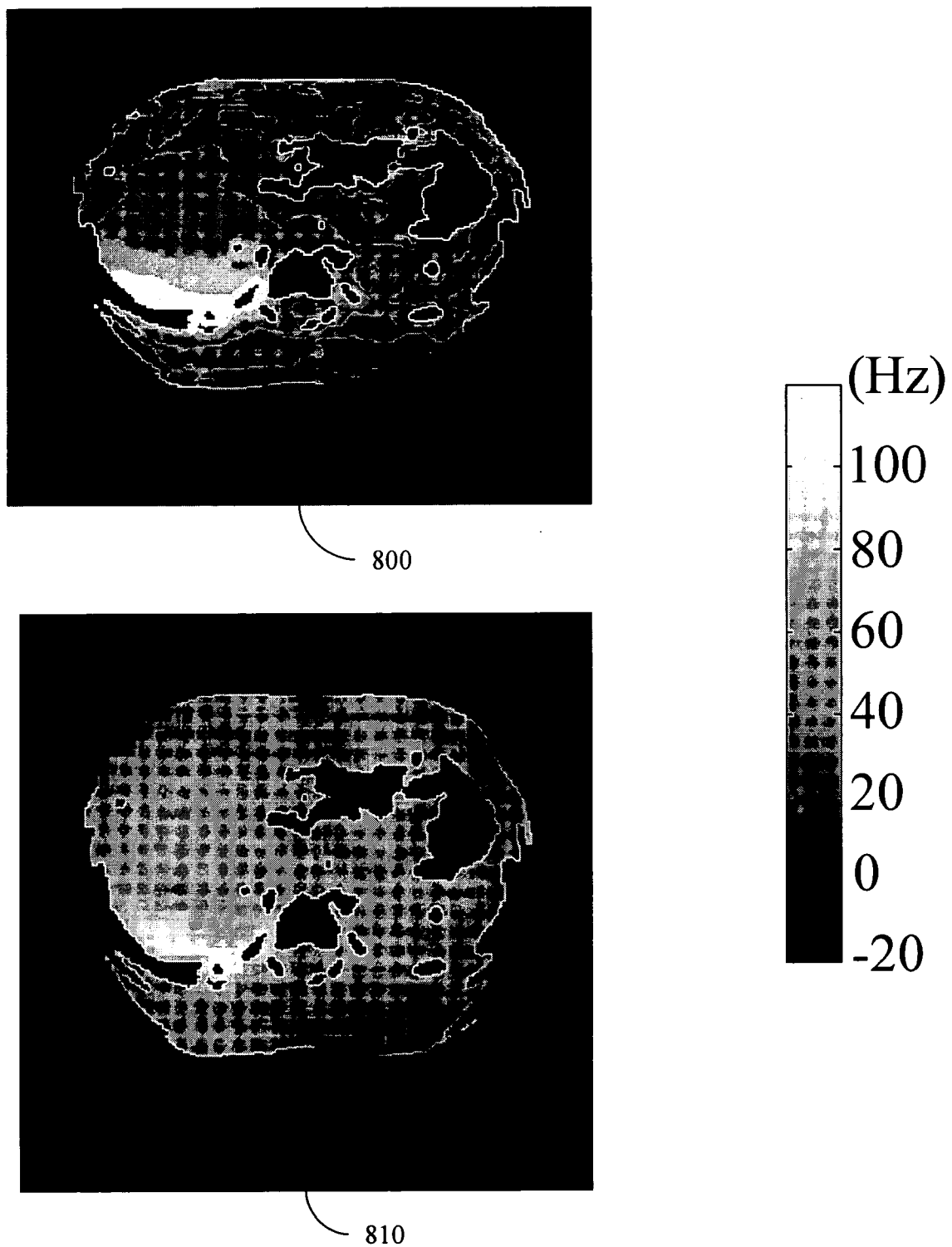
FIG. 8 illustrates two estimated $B_0$ off-resonance frequency field maps for the abdominal MRI images illustrated in FIG. 6.

FIG. 8 illustrates two estimated $B_0$ off-resonance frequency field maps associated with the abdominal images provided in FIG. 6. Image 800 illustrates an estimated $B_0$ off-resonance frequency field map associated with a S2PD technique and image 810 illustrates an estimated $B_0$ off-resonance frequency field map associated with an example BRORC-S2PD technique. In both field maps, the gray values represent $B_0$ off-resonance frequency in Hz and the background is set to 0 Hz.

Table 1 summarizes the total number of complex multiplications required for example image reconstructions. An example BRORC-S2PD technique was applied to the scanned object regions and not to the background in image 600 (FIG. 6) and image 700 (FIG. 7). The numbers in parentheses in the fourth column of Table 1 indicate the total number of complex multiplications if the entire 256×256 image matrix for image 600 or image 700 was processed with the same parameters. For the abdominal and cardiac images, the BRORC-S2PD technique required only 24.0% and 27.4% of the number of computations of that required for the original S2PD technique. For the cardiac images, the computational cost of the BRORC-S2PD technique was further reduced when it was applied to a 128×128 central region of image 700. In contrast, it is not possible to process specific regions of an MRI image with conventional S2PD techniques. Therefore, in this case, the computational cost of the example BRORC-S2PD technique was 13.4% of that for the S2PD technique.

TABLE 1

S2PD and BRORC-S2PD water image reconstruction computational costs

| Image | Algorithm | Total number of complex multiplications | |
|---|---|---|---|
| 610 | Spiral2PD (L = 26) | $61.34 \times 10^6$ | |
| 620 | BRORC-Spiral2PD $(M_1, m_1, r_1) =$ (16, 8, 0.25), $(M_2, r_2) =$ (32, 0.5) | $14.70 \times 10^6$ with $s_1{}^a = 1619 =$ $0.395 \times (256/4)^2$ and $s_2{}^b = 164 =$ $0.641 \times (256/16)^2$ | $(30.41 \times 10^6)$ [c] |
| 710 | Spiral2PD (L = 29) | $68.42 \times 10^6$ | |
| 720 | BRORC-Spiral2PD $(M_1, m_1, r_1) =$ (16, 8, 0.25), $(M_2, r_2) =$ (32, 0.5) | $18.74 \times 10^6$ with $s_1{}^a = 2181 =$ $0.532 \times (256/4)^2$ and $s_2{}^b = 206 =$ $0.805 \times (256/16)^2$ | $(30.41 \times 10^6)$ [c] |
| A 128 × 128 heart region of 720 | BRORC-Spiral2PD $(M_1, m_1, r_1) =$ (16, 8, 0.25), $(M_2, r_2) =$ (32, 0.5) | $9.18 \times 10^6$ with $s_1{}^a = 1024 =$ $(128/4)^2$ and $s_2{}^b =$ $64 = (128/16)^2$ | $(30.41 \times 10^6)$ [c] |

[a] $s_1$ denotes the total number of blocks processed for frequency estimation in the BRORC-S2PD algorithm.
[b] $s_2$ denotes the total number of blocks processed for water image reconstruction in the BRORC-S2PD algorithm.
[c] the total number of complex multiplications if the entire image matrix is processed.

Example methods may be better appreciated with reference to the flow diagrams of FIGS. 9 through 13. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks.

In the flow diagrams, blocks denote "processing blocks" that may be implemented with logic. The processing blocks may represent a method step and/or an apparatus element for performing the method step. A flow diagram does not depict syntax for any particular programming language, methodology, or style (e.g., procedural, object-oriented). Rather, a flow diagram illustrates functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown and/or that blocks may be combined or separated into multiple components. It will be appreciated that the processes may be implemented using various programming approaches like machine language, procedural, object oriented and/or artificial intelligence techniques.

Figure 9:
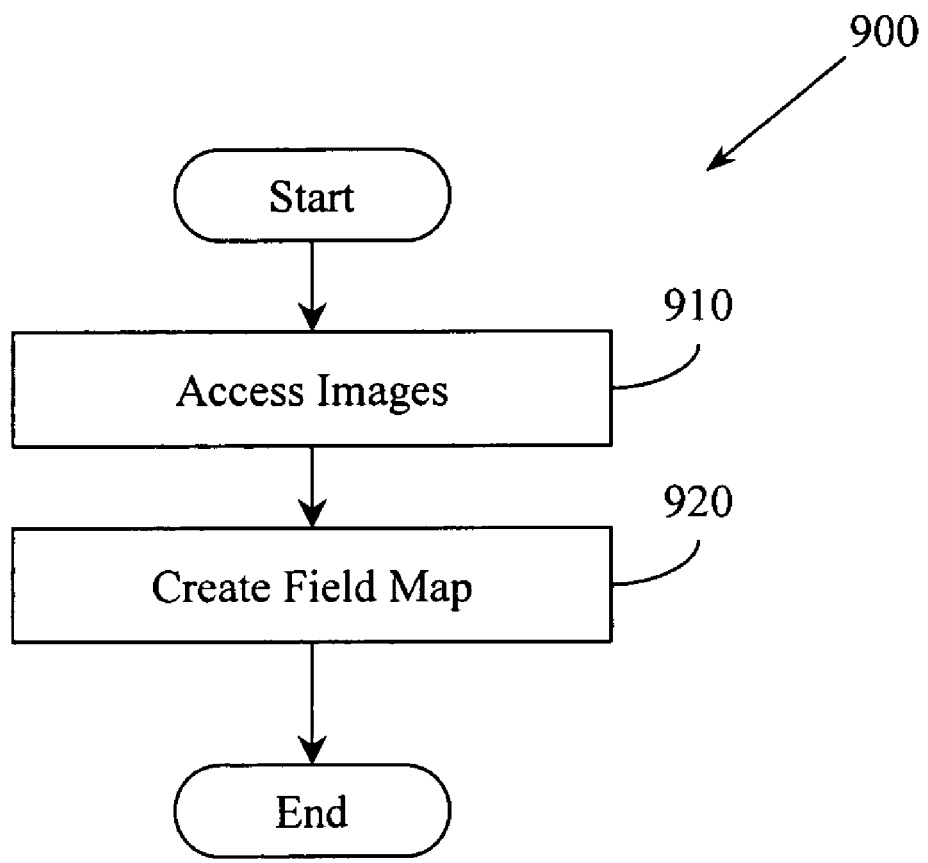
FIG. 9 illustrates an example computer-executable method associated with building an estimated $B_0$ off-resonance frequency field map using a BRORC-S2PD technique.

FIG. 9 illustrates an example computer-executable method 900 associated with building a $B_0$ off-resonance frequency field map using a BRORC-S2PD technique. At 910, two reconstructed images $S_0$ and $S_1$ are accessed. Accessing $S_0$ and $S_1$ may include acquiring MRI images using, for example, the MRI acquisition parameters described above for $S_0$ and $S_1$.

Figure 10:
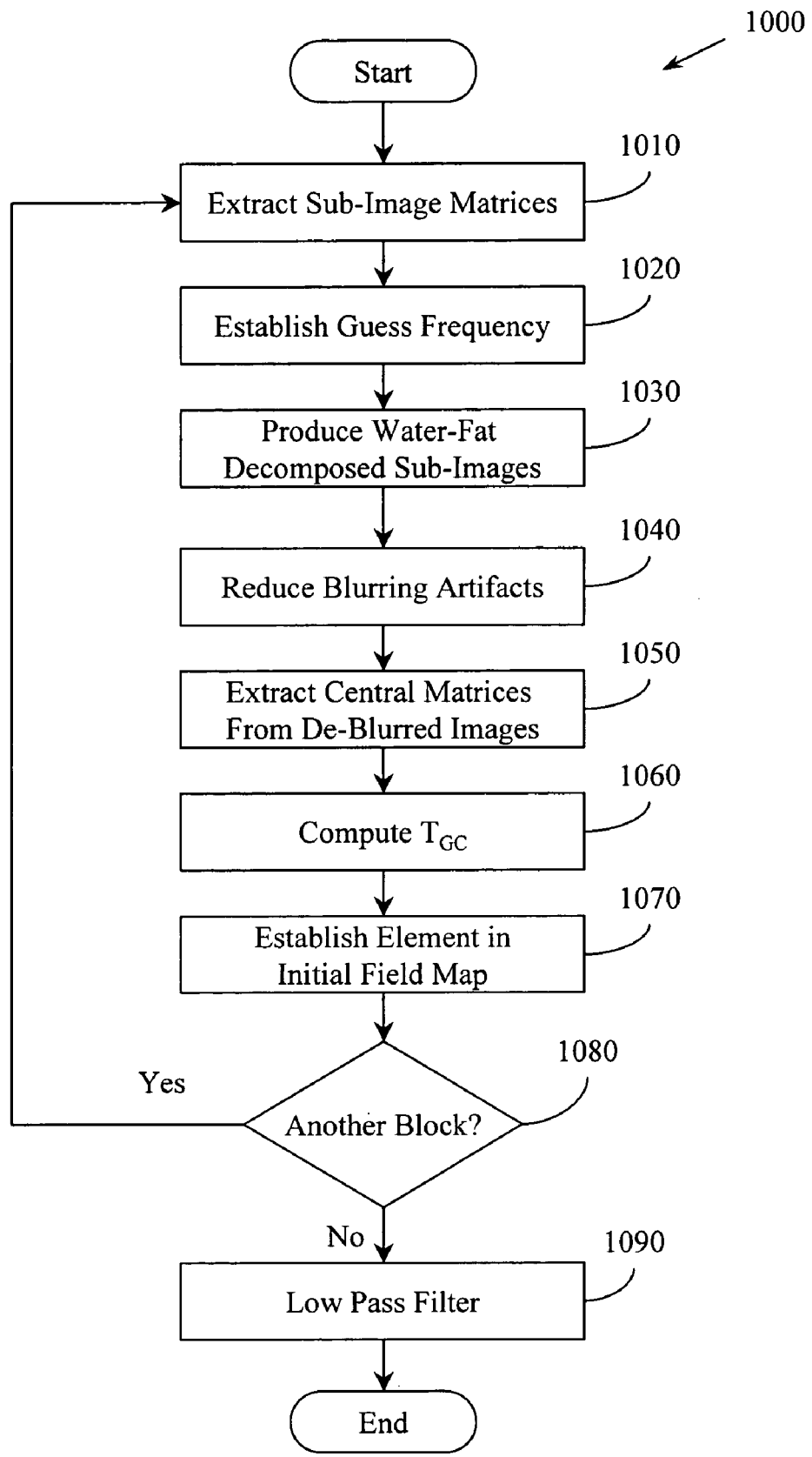
FIG. 10 illustrates another example computer-executable method associated with building an estimated $B_0$ off-resonance frequency field map using a BRORC-S2PD technique.

At 920, a field map may be created in a block-by-block manner using block-based local $B_0$ off resonance frequency estimations. Creating the field map may include several actions. Thus, FIG. 10 illustrates an example computer-executable method 1000 associated with building an estimated $B_0$ off-resonance frequency field map using a BRORC-S2PD technique.

Method 1000 may include, at 1010, extracting sub-image matrices from related locations in $S_0$ and $S_1$. At 1020, a guess frequency may be established for use in decomposing the extracted sub-image matrices. As described above, the guess frequency may be a pure guess, may be based on values for neighboring regions, and so on. At 1030, the extracted sub-image matrices may be processed to produce water-fat decomposed sub-images. In one example, the water-fat decomposed sub-images may be processed according to:

$$W_g' = (S_0 + S_1 \exp(-i\phi_g))/2 \qquad \text{[Equation 9], and}$$

$$F_g' = (S_0 - S_1 \exp(-i\phi_g))/2 \qquad \text{[Equation 10], with}$$

$$\phi_g = 2\pi f_g \cdot \tau \qquad \text{[Equation 11]}$$

where $W_g'$ and $F_g'$ are the decomposed water and fat sub-images.

At 1040, blurring artifacts may be reduced in the decomposed water and fat sub-images. In one example, to generate a de-blurred water sub-image $W_g$ from $W_g'$, a 2D-FFT is performed on $W_g'$ to obtain Fourier data. Frequency demodulation is then performed on the Fourier data with the frequency $f_g$. A 2D-IFFT may then be performed on the demodulated Fourier data to reconstruct de-blurred water sub-image $W_g$. As described above, a de-blurred fat sub-image may be produced using a similar technique.

At 1050, central matrices $W_{gc}$ and $F_{gc}$ may be extracted from $W_g$ and $F_g$. Signals in the central matrices $W_{gc}$ and $F_{gc}$ may then be used for frequency estimation as described by Equation 16. For example, at 1060, $T_{gc}$ may be computed from $W_{gc}$ and $F_{gc}$ using:

$$T_{gc} = \overline{\left(\frac{W_{gc} + F_{gc}}{W_{gc} - F_{gc}}\right)} \qquad \text{[Equation 12]}$$

At 1070, an element in an initial estimated $B_0$ off-resonance frequency field map can be established by setting the computed off-resonance frequency to $f_e$ for a central region described by the $r_1 M_1 \times r_1 M_1$ pixels associated with the region from which the sub-image matrices were extracted at 1010. In one example $f_e$ may be determined using:

$$f_e = f_g - f_d \qquad \text{[Equation 14], with}$$

$$f_d = \frac{\tan^{-1}\left(\frac{\operatorname{Im}(T_{gc})}{\operatorname{Re}(T_{gc})}\right)}{2\pi \cdot \tau} \qquad \text{[Equation 15]}$$

At 1080, a determination may be made concerning whether to process another block. If the determination is Yes, then processing may return to 1010. Otherwise processing may proceed to 1090. At 1090, a final estimated $B_0$ off-resonance frequency field map may be created by applying a low pass filter to the initial map constructed by repetitions of the actions 1010 through 1070.

While FIG. 10 illustrates various actions occurring in serial, it is to be appreciated that various actions illustrated in FIG. 10 could occur substantially in parallel. By way of illustration, a first process could extract a water sub-image while a second process could extract a fat sub-image. Similarly, a third process could decompose the water sub-image, while a fourth process could decompose the fat sub-image. Likewise, a fifth process could reduce blurring artifacts in the water sub-image while a sixth process could reduce blurring artifacts in the fat sub-image. A seventh process could extract a small central image from the water sub-image while an eighth process could extract a small central image from the fat sub-image. While eight processes are described, it is to be appreciated that a greater and/or lesser number of processes could be employed and that lightweight processes, regular processes, threads, and other approaches could be employed. It is to be appreciated that other example methods may, in some cases, also include actions that occur substantially in parallel.

Figure 11:
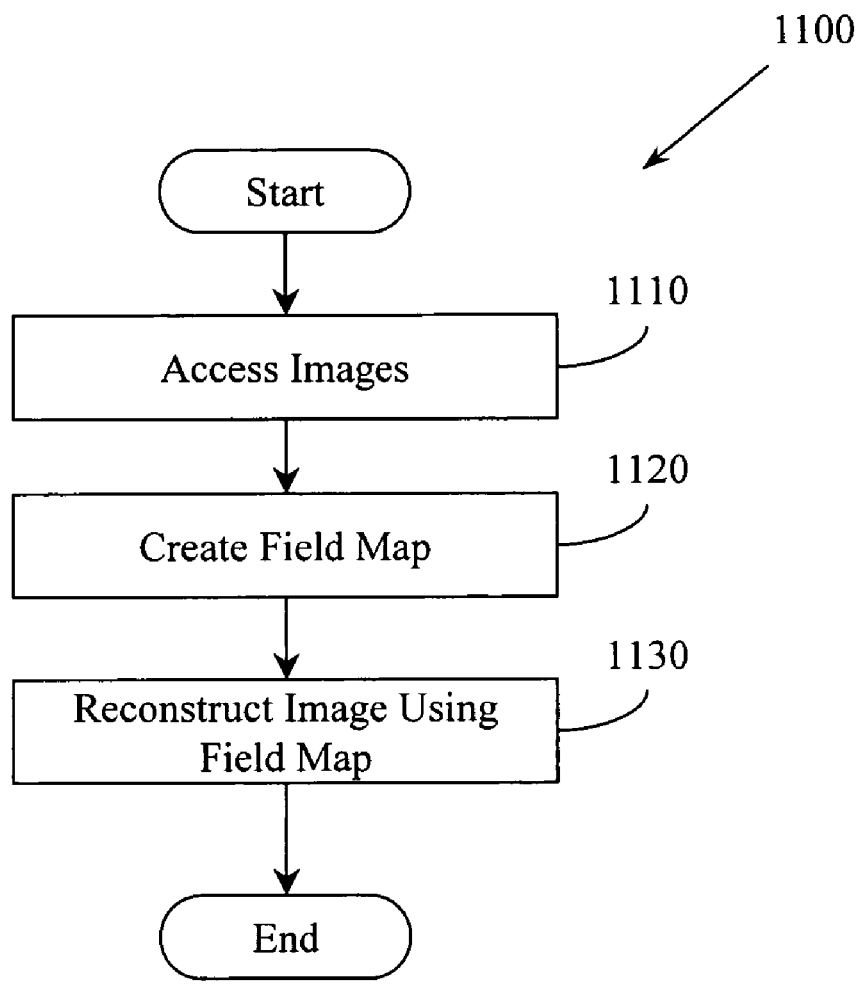
FIG. 11 illustrates another example computer-executable method associated with BRORC-S2PD based water image reconstruction.
Figure 12:
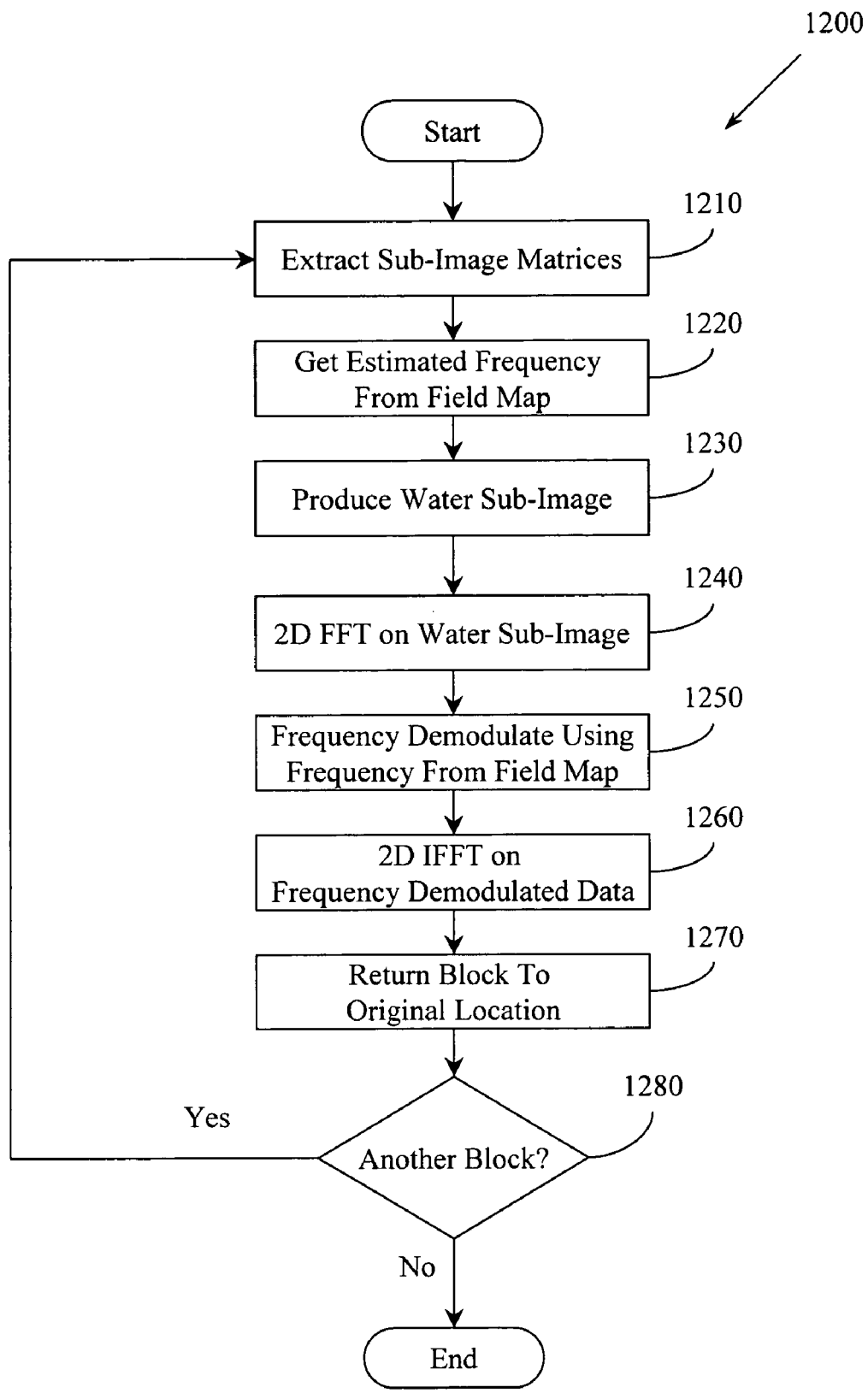
FIG. 12 illustrates another example computer-executable method associated with BRORC-S2PD based water image reconstruction.

FIG. 11 illustrates an example computer-executable method 1100 associated with BRORC-S2PD based water image reconstruction. At 1110, two reconstructed images are accessed. In one example, accessing the images may include acquiring the images. The reconstructed images may be similar to those described in association with FIG. 9 (e.g., $S_0$, $S_1$). At 1120, a field map may be created in a block-by-block manner using block-based local $B_0$ off-resonance frequency estimations like those described in association with FIG. 10. At 1130, an image(s) may be reconstructed using the field map created at 1120. Reconstructing an image may include several actions. Thus, FIG. 12 illustrates an example computer-executable method 1200 associated with BRORC-S2PD based water image reconstruction.

At 1210, sub-image matrices may be extracted from corresponding locations in the images $S_0$ and $S_1$. At 1220, an estimated frequency may be retrieved from the estimated $B_0$ off-resonance frequency field map created at 1120. In one example, the estimated frequency $\bar{f}_e$ is the mean $B_0$ off-resonance frequency of the central $r_2 M_2 \times r_2 M_2$ pixels ($0 < r_2 \leq 1$) in the selected $M_2 \times M_2$ matrix in the estimated $B_0$ off-resonance frequency field map. While the mean $B_0$ off-resonance frequency is described, it is to be appreciated that $\bar{f}_e$ may be selected in other manners.

At 1230, a water sub-image may be produced using $\bar{f}_e$. In one example, the water sub-image may be computed using:

$$W'' = (S_0 + S_1 \exp(-i\phi_e))/2 \qquad \text{[Equation 17], where}$$

$$\phi_e = 2\pi \bar{f}_e \cdot \tau \qquad \text{[Equation 18]}.$$

At 1240, a 2D-FFT may be performed on the water sub-image to obtain Fourier data. At 1250, frequency demodulation is performed on the Fourier data with the frequency $\bar{f}_e$ to produce a demodulated data. While a frequency $\bar{f}_e$ is described, it is to be appreciated that other frequencies like $f_e$ may be employed.

At 1260, a 2D-IFFT may be performed on the demodulated data produced at 1250. Since the outer regions of the water sub-image may exhibit artifacts, in one example only the central $r_2 M_2 \times r_2 M_2$ pixels of a de-blurred water sub-image are retained for insertion into a final reconstructed image. Thus, at 1270, a portion of the de-blurred water sub-image may be returned to the locations in $S_0$ and $S_1$ from which it was acquired. Additionally, and/or alternatively, the portion may be stored in a new image separate from the original reconstructed images. At 1280, a determination is made concerning whether another block is to be decomposed and de-blurred. If the determination at 1280 is Yes, then processing may return to 1210, otherwise processing may conclude. Unlike conventional techniques, it is to be appreciated that method 1200 may be employed to reconstruct a portion of an image, rather than entire image, using a field map created at 1120.

In one example, methodologies are implemented as processor executable instructions and/or operations provided on a computer-readable medium. Thus, in one example, a computer-readable medium may store processor executable instructions operable to perform a method that includes acquiring two reconstructed MRI images of an item located in a $B_0$ field, creating an estimated $B_0$ off-resonance frequency field map using a BRORC-S2PD technique without performing multi-frequency testing and reconstructing a de-blurred water image using a BRORC-S2PD technique and the estimated $B_0$ off-resonance frequency field map. The $B_0$ off-resonance frequency map is related to the $B_0$ field present when the MRI images were acquired. While the above method is described being provided on a computer-readable medium, it is to be appreciated that other example methods described herein can also be provided on a computer-readable medium.

Figure 13:
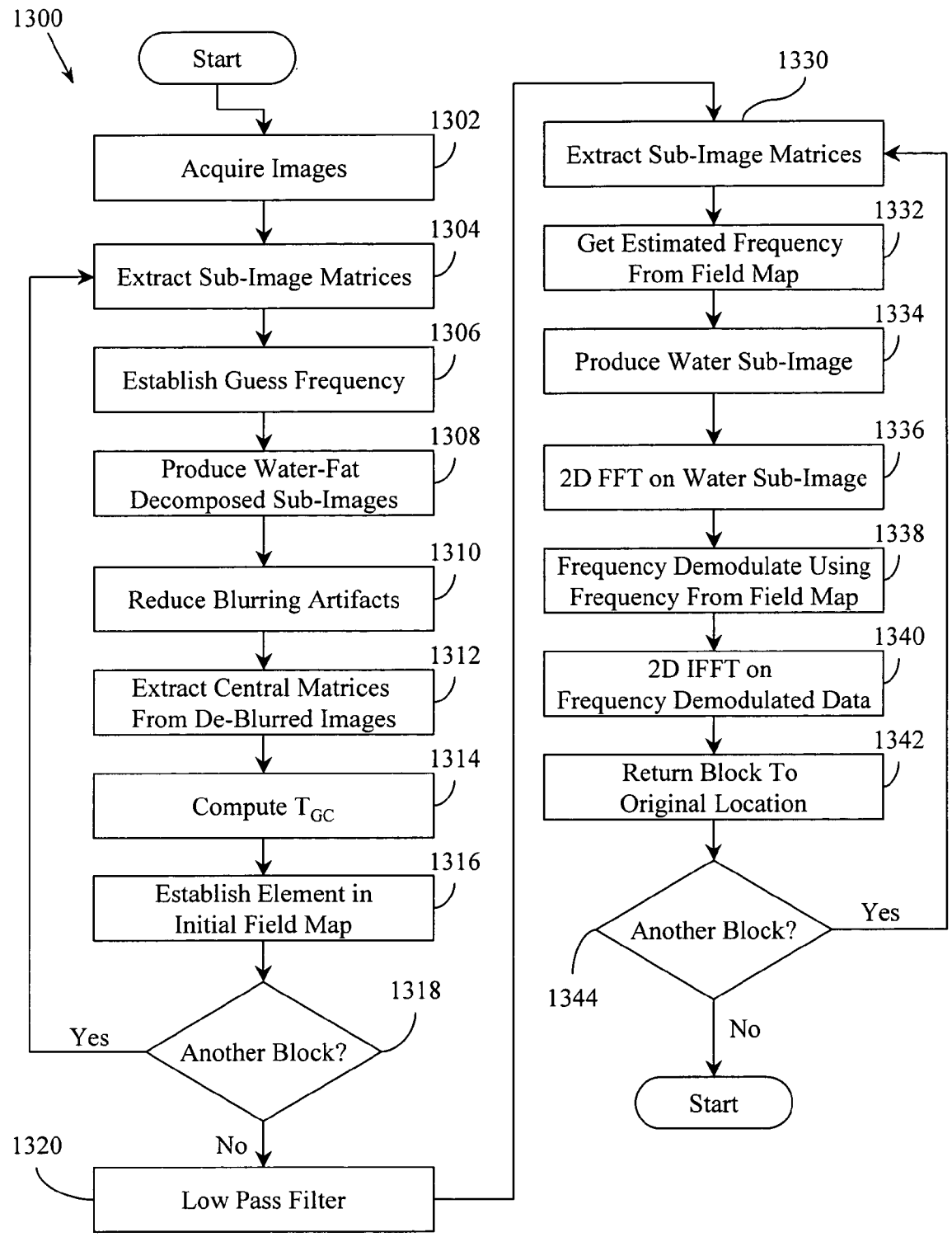
FIG. 13 illustrates another example computer-executable method associated with BRORC-S2PD.

FIG. 13 illustrates an example computer-executable method 1300 associated with producing an estimated $B_0$ off-resonance frequency field map using a BRORC-S2PD technique and then reconstructing a water image using the map. At 1302, two reconstructed images of an item in a $B_0$ field produced by an MRI apparatus are acquired. The reconstructed images may be, for example, $S_0$ and $S_1$ as described earlier. The $B_0$ off-resonance frequency field map is related to the $B_0$ field present when the MRI images were acquired. At 1304, sub-image matrices may be extracted from corresponding locations in $S_0$ and $S_1$. At 1306, a guess frequency may be established for use in decomposing the extracted sub-image matrices. At 1308, the extracted sub-image matrices may be processed to produce water-fat decomposed sub-images.

At 1310, blurring artifacts may be reduced in the decomposed water and fat sub-images. At 1312, central matrices $W_{gc}$ and $F_{gc}$ may be extracted from the water sub-image and the fat sub-image. Signals in the central matrices $W_{gc}$ and $F_{gc}$ may then be used for frequency estimation as described by Equation 16. For example, at 1314, $T_{gc}$ may be computed from the central matrix $W_{gc}$ extracted from the water sub-image and $F_{gc}$ extracted from the fat sub-image using, for example:

$$T_{gc} = \overline{\left(\frac{W_{gc} + F_{gc}}{W_{gc} - F_{gc}}\right)} \qquad \text{[Equation 12]}$$

At 1316, an element in an initial estimated $B_0$ off-resonance frequency field map can be established by setting its value to the off-resonance frequency $f_e$ computed for a central set of pixels associated with the region from which $S_0$ and $S_1$ were extracted. At 1318, a determination may be made concerning whether to process another block. If the determination is Yes, then processing may return to 1304. Otherwise processing may proceed to 1320 where a final $B_0$ estimated off-resonance frequency field map may be created by applying a low pass filter to the initial estimated $B_0$ off-resonance frequency map constructed by repetitions of the actions 1304 through 1316.

At 1330, sub-image matrices may again be extracted from corresponding locations in $S_0$ and $S_1$. At 1332, an estimated frequency for the region from which the sub-image matrices were extracted may be retrieved from the final estimated $B_0$ off-resonance frequency field map. At 1334, a water sub-image may be produced from a sub-image matrix using a frequency like $\bar{f}_e$ described above. At 1336, a 2D-FFT may be performed on the water sub-image to obtain Fourier data and at 1338 a frequency demodulation may be performed on the Fourier data to produce a demodulated data. At 1340, a 2D-IFFT may be performed on the demodulated data produced at 1338 to produce a block of de-blurred data. At 1342, all or a portion of the de-blurred block may be returned to the locations in $S_0$ and $S_1$ from which it was extracted. At 1344, a determination is made concerning whether another block is to be decomposed and de-blurred. If the determination at 1344 is Yes, then processing may return to 1330, otherwise processing may conclude. Unlike conventional techniques, it is to be appreciated that method 1300 may be employed to reconstruct a portion of an image, rather than an entire image.

Figure 14:
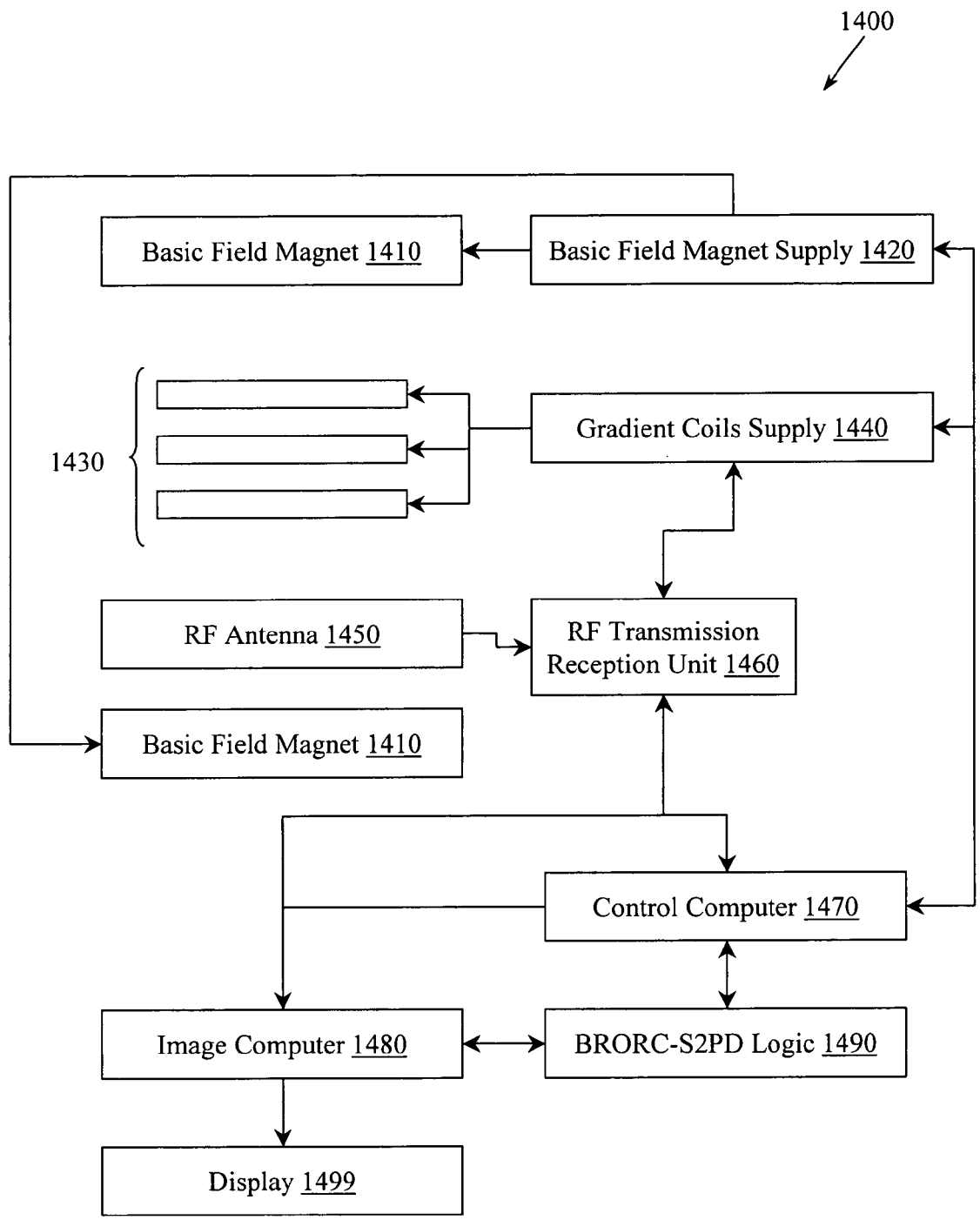
FIG. 14 illustrates an example MRI apparatus configured to perform BRORC-S2PD processing.

FIG. 14 illustrates an example MRI apparatus 1400. The apparatus 1400 includes a basic field magnet 1410 and a basic field magnet supply 1420. Ideally, the basic field magnets 1410 would produce a uniform $B_0$ field. However, in practice, the $B_0$ field may not be uniform, and may vary over an object being imaged by the MRI apparatus 1400. Therefore, the MRI apparatus 1400 may include a BRORC-S2PD logic 1490 that is configured to facilitate performing example methods described herein.

The MRI apparatus 1400 may include gradient coils 1430 configured to emit gradient magnetic fields like $G_S$, $G_P$ and $G_R$. The gradient coils 1430 may be controlled, at least in part, by a gradient coils supply 1440. The MRI apparatus 1400 may also include an RF antenna 1450 that is configured to generate RF pulses and to receive resulting magnetic resonance signals from an object to which the RF pulses are directed. Alternatively, separate RF transmission and reception coils can be employed. The RF antenna 1450 may be controlled, at least in part, by an RF transmission/reception unit 1460. The gradient coils supply 1440 and the RF transmission/reception unit 1460 may be controlled, at least in part, by a control computer 1470. In one example, the control computer 1470 may be programmed to perform methods like those described herein.

The magnetic resonance signals received from the RF antenna 1450 can be employed to generate an image, and thus may be subject to a transformation process like a two dimensional FFT that generates pixilated image data. The transformation can be performed by an image computer 1480 or other similar processing device. In one example, image computer 1480 may be programmed to perform methods like those described herein. The image data may then be shown on a display 1499.

While FIG. 14 illustrates an example MRI apparatus 1400 that includes various components connected in various ways, it is to be appreciated that other MRI apparatus may include other components connected in other ways. However, to implement the example systems and methods described herein, an MRI apparatus will be configured with a BRORC-S2PD logic and/or have a component programmed with BRORC-S2PD computer executable instructions. In one example, an existing MRI apparatus may be upgraded or reconfigured with a BRORC-S2PD logic 1490. In different examples, the BRORC-S2PD logic 1490 may be permanently and/or removably attached to an MRI apparatus.

Figure 15:
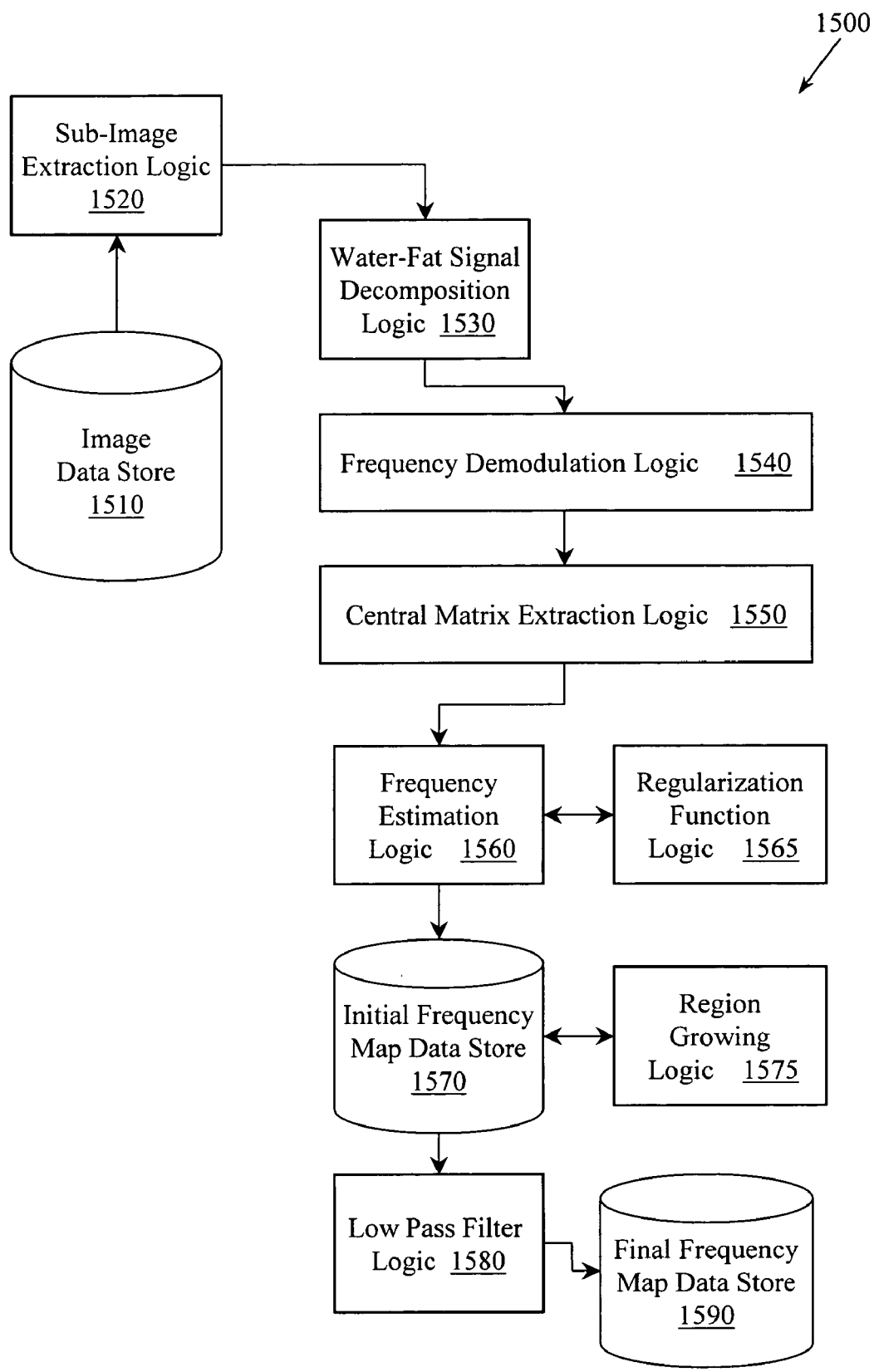
FIG. 15 illustrates an example BRORC-S2PD apparatus.

FIG. 15 illustrates an example BRORC-S2PD apparatus 1500. The apparatus 1500 may include, for example, an image data store 1510 in which original images like $S_0$ and $S_1$ described above may be stored. The image data store 1510 may also be configured to store additional data items like sub-matrices extracted from an image, decomposed signals, demodulated data, de-blurred images, and so on. While a separate image data store 1510, initial frequency map data store 1570 and final frequency map data store 1590 are illustrated, it is to be appreciated that a greater and/or lesser number of data stores may be employed to store the data associated with the processing performed by the BRORC-S2PD apparatus 1500. Thus, in different examples, the data stores may be consolidated or further distributed.

Apparatus 1500 may also include a sub-image extraction logic 1520. The sub-image extraction logic 1520 may be configured to extract a sub-image from a reconstructed image stored in the image data store 1510. For example, original reconstructed images $S_0$ and $S_1$ may be N×N in size. The sub-image extraction logic 1520 may be configured to facilitate retrieving from the image data store 1510 a sub-image matrix of size $M_1 \times M_1$, where $M_1 < N$. The sub-image extraction logic 1520 may be configured to provide an extracted sub-image to a water-fat signal decomposition logic 1530. In some examples (e.g., apparatus 1700, FIG. 17) a sub-image extraction logic may provide a sub-image to different logics and thus may be configured with a local memory to facilitate reducing accesses to image data store 1510.

Apparatus 1500 may also include a water-fat signal decomposition logic 1530. The water-fat signal decomposition logic 1530 may be configured to decompose water-fat signals for the sub-images extracted by sub-image extraction logic 1520. In one example, the decomposition may depend, at least in part, on a guess frequency $f_g$ for the $B_0$ frequency estimated for the region from which the sub-image was extracted. In one example, the original guess frequency $f_g$ may be zero. If a guess frequency $f_g$ close to the true frequency f of a particular sub-image region is available, then water-fat decomposition may be performed by water-fat signal decomposition logic 1530 using:

$$W_g' = (S_0 + S_1 \exp(-i\phi_g))/2 \quad \text{[Equation 9], and}$$

$$F_g' = (S_0 - S_1 \exp(-i\phi_g))/2 \quad \text{[Equation 10], with}$$

$$\phi_g = 2\pi f_g \cdot \tau \quad \text{[Equation 11]}$$

where $W_g'$ and $F_g'$ are decomposed water and fat sub-images. In one example, $W_g'$ and $F_g'$ may be stored in image data store 1510. In another example, $W_g'$ and $F_g'$ may be stored temporarily in the water-fat signal decomposition logic 1530 and/or passed to a frequency demodulation logic 1540. While a single water-fat signal decomposition logic 1530 is illustrated, it is to be appreciated that in some examples apparatus 1500 may include separate water and fat signal decomposition logics.

The frequency demodulation logic 1540 may be configured to reduce blurring artifacts in $W_g'$ to generate a de-blurred water image $W_g$ from $W_g'$. For example, the frequency demodulation logic 1540 may be configured to perform a 2D-FFT on $W_g'$ to obtain Fourier data, to frequency demodulate the Fourier data with the frequency $f_g$, and then to perform a 2D-IFFT on the demodulated Fourier data to reconstruct a water sub-image $W_g$. While a water sub-image is described, it is to be appreciated that a fat sub-image $F_g$ may also be produced by frequency demodulation logic 1540.

Apparatus 1500 may also include a central matrix extraction logic 1550 that may be configured to extract central matrices (e.g., $W_{gc}$, $F_{gc}$) from the water sub-image $W_g$ and fat sub-image $F_g$ produced by the frequency demodulation logic 1540. Local frequency estimation may then be performed by a frequency estimation logic 1560. As part of local frequency estimation, $T_{gc}$ may be computed by the frequency estimation logic 1560 from the extracted central matrices $W_{gc}$ and $F_{gc}$.

Thus, in one example, a first estimate of the local $B_0$ off-resonance frequency $f_e$, may be determined by the frequency estimation logic 1560 using:

$$f_e = f_g - f_d \quad \text{[Equation 14]}.$$

The frequency estimation logic 1560 may then update an initial map stored in an initial $B_0$ off-resonance frequency field map data store 1570 by inserting $f_e$ at a location associated with the extracted sub-image. The value of $f_e$ may be relatively accurate if the region corresponding to $W_{gc}$ and/or $F_{gc}$ contains either predominantly water or fat tissue. However, frequency estimation may be unstable for voxels containing nearly equal water and fat signals. Therefore, apparatus 1500 may include a regularization function logic 1565 that is configured to perform a regularization function R associated with frequency estimation. In one example, an $f_e$ produced by the frequency estimation logic 1560 may be manipulated according to:

$$f_e = f_g - R \cdot f_d \quad \text{[Equation 16]}$$

An example function R is illustrated in FIG. 3. This regularization function is based on the assumption that $|f - f_g|$ is small when $f_g$ is set to the average frequency of the neighboring frequency-estimated blocks. While one regularization function R is illustrated, it is to be appreciated that regularization function logic 1565 may implement various regularization functions.

Initial frequency map data store 1570 may store the initial estimated $B_0$ off-resonance frequency map. The initial map may begin with no blocks for which a frequency has been estimated and may grow over time. In one example, the central $r_1 M_1 \times r_1 M_1$ pixels ($0 < r_1 \leq 1$) of an $M_1 \times M_1$ matrix extracted by sub-image extraction logic 1520 and processed by water-fat signal decomposition logic 1530, frequency demodulation logic 1540, and frequency estimation logic 1560 are set to $f_e$ following the calculation of Equation 16. $B_0$ frequencies for an entire image region or for a specific region(s) of an image may then be estimated by extracting other sub-images and processing them through the logics. However, subsequent blocks may benefit from the initial frequency estimation for the first block and other previously processed blocks. Thus, a region growing logic 1575 may facilitate performing block-based region growing actions to facilitate providing an estimated frequency $f_e$ for the guess frequency $f_g$ instead of an arbitrary value like 0. In one example, after the $B_0$ frequency is estimated for a single block, the local $B_0$ frequencies of the neighboring blocks may be estimated by the region growing logic 1575 using Equation 16. The output $f_e$ of the frequency-determined block may then be used by the frequency estimation logic 1560, the frequency demodulation logic 1540, the water-fat signal decomposition logic 1530, and so on, as $f_g$ for frequency estimation of the neighboring blocks.

Apparatus 1500 may also include a low pass filter logic 1580. The low pass filter logic 1580 may be configured to apply a low pass filter to an initial estimated $B_0$ off-resonance frequency field map stored in data store 1570. The output of applying the low pass filter may be a final estimated $B_0$ off-resonance frequency field map that may be stored in data store 1590. Once the final estimated $B_0$ off-resonance frequency field map is produced, other components like those illustrated in apparatus 1700 (FIG. 17) may participate in producing a de-blurred image from an initial image using the final estimated $B_0$ off-resonance frequency field map.

Figure 16:
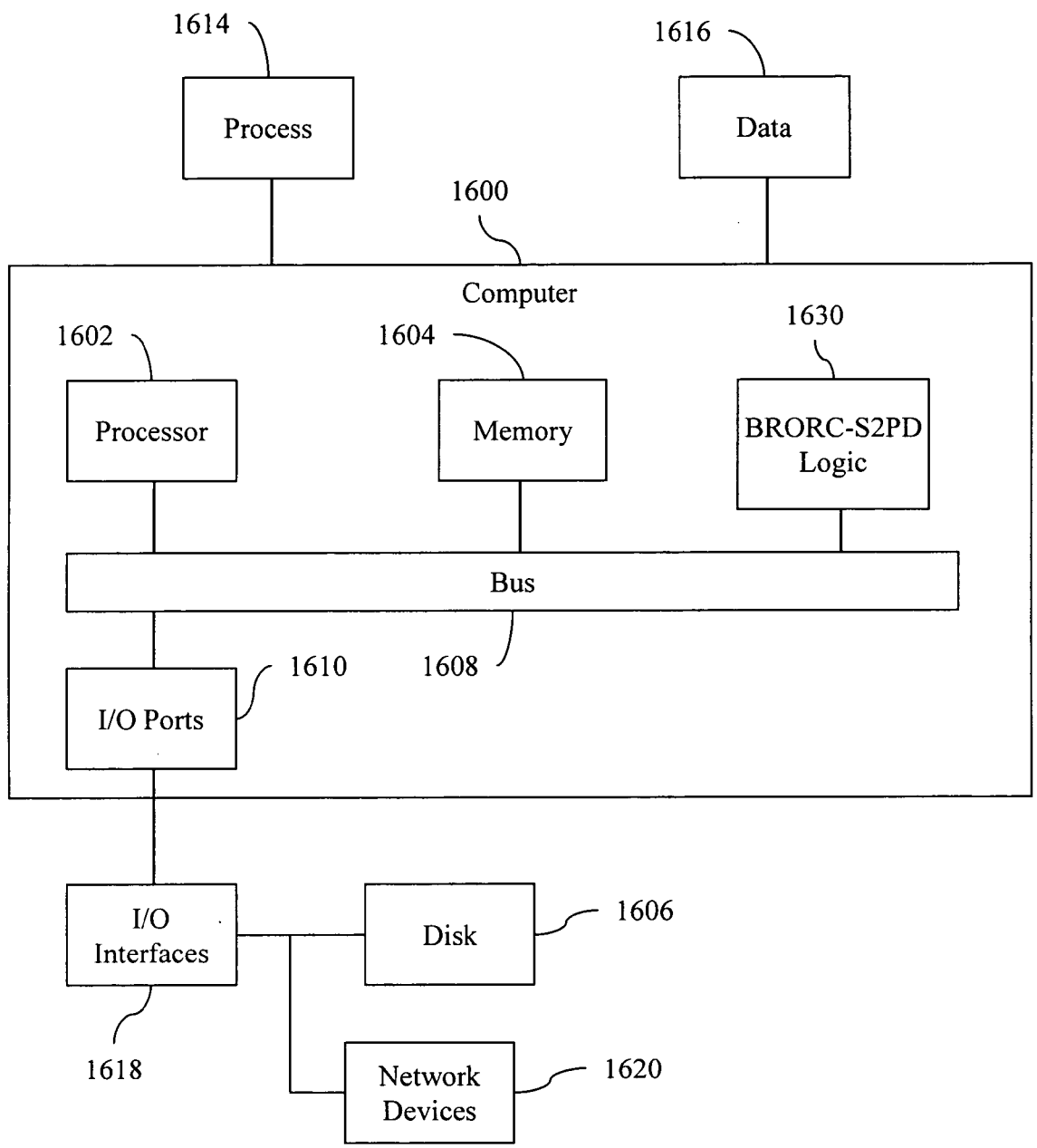
FIG. 16 illustrates an example computing environment in which example systems and methods illustrated herein can operate.

FIG. 16 illustrates a computer 1600 that includes a processor 1602, a memory 1604, and input/output ports 1610 operably connected by a bus 1608. In one example, the computer 1600 may include a BRORC-S2PD logic 1630 that is configured to facilitate constructing an estimated $B_0$ off-resonance frequency field map using a block-by-block approach without performing multi-frequency testing. Thus, the BRORC-S2PD logic 1630, whether implemented in computer 1600 as hardware, firmware, software, and/or a combination thereof may provide means for acquiring a reconstructed image from an MRI apparatus and means for producing an estimated $B_0$ off-resonance frequency field map using a BRORC-S2PD technique. The BRORC-S2PD logic 1630 may be permanently and/or removably attached to the computer 1600. In different examples, computer 1600 may be operably connected to and/or integrated with an MRI apparatus.

The processor 1602 can be a variety of various processors including dual microprocessor and other multi-processor architectures. The memory 1604 can include volatile memory and/or non-volatile memory. The non-volatile memory can include, but is not limited to, ROM, PROM, EPROM, EEPROM, and the like. Volatile memory can include, for example, RAM, synchronous RAM (SRAM), dynamic RAM (DRAM), synchronous DRAM (SDRAM), double data rate SDRAM (DDR SDRAM), and direct RAM bus RAM (DRRAM).

A disk 1606 may be operably connected to the computer 1600 via, for example, an input/output interface (e.g., card, device) 1618 and an input/output port 1610. The disk 1606 can include, but is not limited to, devices like a magnetic disk drive, a solid state disk drive, a floppy disk drive, a tape drive, a Zip drive, a flash memory card, and/or a memory stick. Furthermore, the disk 1606 can include optical drives like a CD-ROM, a CD recordable drive (CD-R drive), a CD rewriteable drive (CD-RW drive), and/or a digital video ROM drive (DVD ROM). The memory 1604 can store processes 1614 and/or data 1616, for example. The disk 1606 and/or memory 1604 can store an operating system that controls and allocates resources of the computer 1600.

The bus 1608 can be a single internal bus interconnect architecture and/or other bus or mesh architectures. While a single bus is illustrated, it is to be appreciated that computer 1600 may communicate with various devices, logics, and peripherals using other busses that are not illustrated (e.g., PCIE, SATA, Infiniband, 1394, USB, Ethernet). The bus 1608 can be of a variety of types including, but not limited to, a memory bus or memory controller, a peripheral bus or external bus, a crossbar switch, and/or a local bus. The local bus can be of varieties including, but not limited to, an industrial standard architecture (ISA) bus, a microchannel architecture (MSA) bus, an extended ISA (EISA) bus, a peripheral component interconnect (PCI) bus, a universal serial (USB) bus, and a small computer systems interface (SCSI) bus.

The computer 1600 may interact with input/output devices via i/o interfaces 1618 and input/output ports 1610. Input/output devices can include, but are not limited to, a keyboard, a microphone, a pointing and selection device, cameras, video cards, displays, disk 1606, network devices 1620, and the like. The input/output ports 1610 can include but are not limited to, serial ports, parallel ports, and USB ports.

The computer 1600 can operate in a network environment and thus may be connected to network devices 1620 via the i/o interfaces 1618, and/or the i/o ports 1610. Through the network devices 1620, the computer 1600 may interact with a network. Through the network, the computer 1600 may be logically connected to remote computers. The networks with which the computer 1600 may interact include, but are not limited to, a local area network (LAN), a wide area network (WAN), and other networks. The network devices 1620 can connect to LAN technologies including, but not limited to, fiber distributed data interface (FDDI), copper distributed data interface (CDDI), Ethernet (IEEE 802.3), token ring (IEEE 802.5), wireless computer communication (IEEE 802.11), Bluetooth (IEEE 802.15.1), Zigbee (IEEE 802.15.4) and the like. Similarly, the network devices 1620 can connect to WAN technologies including, but not limited to, point to point links, circuit switching networks like integrated services digital networks (ISDN), packet switching networks, and digital subscriber lines (DSL). While individual network types are described, it is to be appreciated that communications via, over, and/or through a network may include combinations and mixtures of communications.

Figure 17:
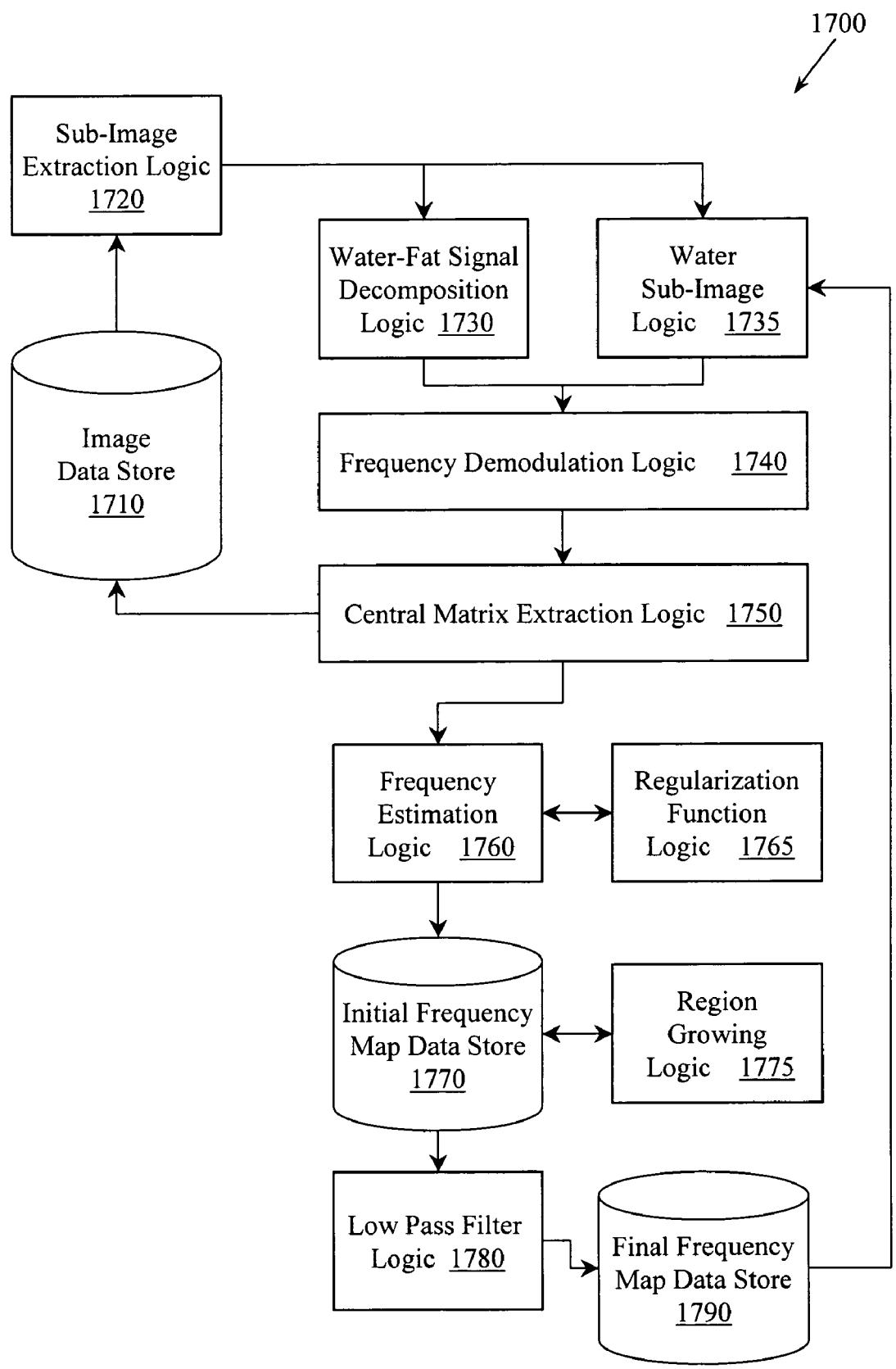
FIG. 17 illustrates another example BRORC-S2PD apparatus.

FIG. 17 illustrates a BRORC-S2PD apparatus 1700. Apparatus 1700 includes elements like those described in association with FIG. 15 (e.g., 1510, 1520, 1530, 1540, 1550, 1560, 1570, 1575, 1580, 1590). Additionally, apparatus 1700 may include elements for de-blurring an image using an estimated $B_0$ off-resonance frequency field map.

Thus, apparatus 1700 may include a water sub-image logic 1735 configured to receive sub-image matrices of a size $M_2 \times M_2$ that are extracted by sub-image extraction logic 1720 from related locations in reconstructed images stored in image data store 1710. In one example, the sub-image extraction logic 1720 may be configured to extract sub-images that may be provided to either a water-fat signal decomposition logic 1730 and/or the water sub-image logic 1735.

The water sub-image logic 1735 may also be configured to separate water signals to produce a separated water sub-image W'. The separated water sub-image W' may be stored in the water sub-image logic 1735 and/or may be provided to frequency demodulation logic 1740. In one example, both water signal separation and frequency demodulation may be performed for the extracted sub-images based on the frequency $\bar{f}_e$. In one example, the water sub-image logic 1735 may produce a water sub-image using:

$$W' = (S_0 + S_1 \exp(-i\phi_e))/2 \quad \text{[Equation 17], where}$$

$$\phi_e = 2\pi \bar{f}_e \tau \quad \text{[Equation 18]}.$$

The water sub-image W' may exhibit blurring artifacts due to its $B_0$ frequency. Therefore, de-blurring may be performed for the water sub-image W' by the frequency demodulation logic 1740. In one example, the frequency demodulation logic 1740 may be configured to perform both processing like that described for frequency demodulation logic 1540 (FIG. 15) and processing for demodulating a selected sub-image matrix to produce a reconstructed water sub-image W.

Thus, frequency demodulation logic 1740 may receive W' and then perform a 2D-FFT on W' to obtain Fourier data. The frequency demodulation logic 1740 may then perform a frequency demodulation on the Fourier data with the frequency $\bar{f}_e$ to produce a demodulated data. The frequency demodulation logic 1740 may then perform a 2D-IFFT on the demodulated data.

Since the outer regions of a sub-image matrix may exhibit artifacts, in one example only the central $r_2 M_2 \times r_2 M_2$ pixels of a de-blurred water sub-image are retained for insertion into a final reconstructed image. Thus, apparatus 1700 may include a central matrix extraction logic 1750. The central matrix extraction logic 1750 may be configured to select a portion of a de-blurred sub-image and to return it to the location from which it was acquired in the image stored in image data store 1710. In one example, a single central matrix extraction logic 1750 may be configured to perform processing performed by both central matrix extraction logic 1550 (FIG. 15) and like that described above for logic 1750. In another example, two central matrix extraction logics may separately perform the processing described for logics 1550 and 1750.

While example systems, methods, and so on, have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A computer-readable medium storing processor executable instructions operable to perform a method, the method comprising:
    acquiring two reconstructed MRI images $S_0$ and $S_1$ of an object located in a $B_0$ field, where acquiring $S_0$ and $S_1$ includes configuring an MRI apparatus to employ normally spatially selective radio frequency (RF) pulses for each repetition time (TR) with an echo time (TE) $=n\tau$ for a first reconstructed image $S_0$ and a TE$=(n+1)\tau$ for a second reconstructed image $S_1$, where n is a positive integer, and $\tau$ is the time during which fat spins process 180° degrees out of phase with respect to water spins, and acquiring $S_0$ and $S_1$ using the MRI apparatus;
    creating an estimated $B_0$ off-resonance frequency field map using a block regional off-resonance correction spiral two point Dixon (BRORC-S2PD) technique without performing multi-frequency testing of the $B_0$ field, where the $B_0$ off-resonance field map is related to the $B_0$ field present when the MRI images were acquired; and
    reconstructing a de-blurred water image using a BRORC-S2PD technique and the estimated $B_0$ off-resonance frequency field map.

2. A computer-readable medium storing processor executable instructions operable to perform a method, the method comprising:
    extracting a first $M_1 \times M_1$ sub-image matrix from a first reconstructed MRI image $S_0$ and extracting a second $M_1 \times M_1$ sub-image matrix from a corresponding location in a second reconstructed MRI image $S_1$, where $S_0$ and $S_1$ are images of an object located in a $B_0$ field, and were acquired using an MRI apparatus configured to employ normally spatially selective radio frequency (RF) pulses for each repetition time (TR) with an echo time (TE)$=n\tau$ for a first reconstructed image $S_0$ and a TE$=(n+1)\tau$ for a second reconstructed image $S_1$, where n is a positive integer, and $\tau$ is the time during which fat spins process 180° degrees out of phase with respect to water spins;
    establishing an initial estimate for a $B_0$ off-resonance frequency $f_g$ associated with locations in $S_0$ and $S_1$ from which the first and second sub-image matrices were extracted;
    producing an $M_1 \times M_1$ decomposed water sub-image $W_g'$ and an $M_1 \times M_1$ decomposed fat sub-image $F_g'$ by performing a water-fat decomposition on the first and second $M_1 \times M_1$ sub-image matrices;
    de-blurring $W_g'$ to form a de-blurred water sub-image $W_g'$ and de-blurring $F_g'$ to form a de-blurred fat sub-image $F_g'$;
    computing a value $T_{GC}$ for a function of $W_g$ and $F_g$ to facilitate estimating a local $B_0$ off-resonance frequency for a location in an initial estimated $B_0$ off-resonance frequency field map associated with the first and second $M_1 \times M_1$ sub-image matrices;
    establishing an element in the initial estimated $B_0$ off-resonance frequency field map for the location associated with the first and second $M_1 \times M_1$ sub-image matrices; and
    producing a final estimated $B_0$ off-resonance frequency field map by applying a low pass filter to the initial estimated $B_0$ off-resonance frequency field map.

3. A magnetic resonance imaging (MRI) apparatus, comprising:
    one or more basic field magnets controlled, at least in part, by a basic field magnet supply, the one or more basic field magnets being configured to produce a $B_0$ field;
    one or more gradient coils controlled, at least in part, by a gradient coils supply, the one or more gradient coils being configured to produce one or more gradient magnetic fields that maybe applied in the $B_0$ field including one or more of $G_S$, $G_P$ and $G_R$;
    a radio frequency (RF) antenna controlled, at least in part, by an RF transmission/reception unit, the RF antenna being configured to generate one or more RF pulses and to receive one or more resulting MRI signals from an object in the $B_0$ field to which the one or more RF pulses are directed;
    one or more computers configured to control, at east in part, the basic field magnet supply, the gradient coils supply, and the RF transmission/reception unit, the one or more computers also being configured to process the one or more resulting MRI signals into an image; and
    a BRORC-S2PD logic configured to facilitate producing an estimated $B_0$ off-resonance frequency field map for the $B_0$ field using a BRORC-S2PD technique.

4. The MRI apparatus of claim 3, where the BRORC-S2PD logic is further configured to de-blur the image.

5. The MRI apparatus of claim 3, where the RF antenna comprises separate RF transmission and reception coils.

6. An apparatus, comprising:
    one or more data stores configured to store one or more of, an initial reconstructed magnetic resonance imaging (MRI) image of an object located in a $B_0$ field, a sub-matrix extracted from the initial reconstructed MRI image, a signal decomposed from the initial reconstructed MRI image, a transformation data associated with the initial reconstructed MRI image as it is being decomposed and de-blurred, a de-blurred reconstructed MRI image, an initial $B_0$ off-resonance estimated frequency field map for the $B_0$ field present when the initial reconstructed MRI image was acquired, and a final $B_0$ off-resonance estimated frequency field map for the $B_0$ field present when the initial reconstructed MRI image was acquired;

a sub-image extraction logic configured to extract first sub-images from the initial reconstructed MRI image;

a water-fat signal decomposition logic configured to receive the first sub-images and to decompose the first sub-images into a decomposed water sub-image and a decomposed fat sub-image based, at least in part, on a guess frequency;

a frequency demodulation logic configured to receive the decomposed water sub-image and the decomposed fat sub-image and to produce a de-blurred water sub-image from the decomposed water sub-image and to produce a de-blurred fat sub-image from the decomposed fat sub-image;

a central matrix extraction logic configured to extract a first central matrix from the de-blurred water sub-image and a second central matrix from the de-blurred fat sub-image;

a frequency estimation logic configured to produce an estimate of a local $B_0$ off-resonance frequency associated with the first central matrix and the second central matrix;

a regularization function logic configured to regularize the estimate of the local $B_0$ off-resonance frequency to reduce an error in the estimate due, at least in part, to an irregularity associated with a voxel in the object containing substantially equivalent water and fat signals;

a region growing logic configured to selectively provide an estimated value for the guess frequency, where the estimated value is based, at least in part, on one or more estimated frequencies in the initial estimated $B_0$ off-resonance frequency field map; and a low pass filter logic configured to apply a low pass filter to the initial estimated $B_0$ off-resonance frequency field map to produce the final estimated $B_0$ off-resonance frequency field map.

7. The apparatus of claim 6, where the water-fat signal decomposition logic produces the decomposed water sub-image according to:

$W_g'=(S_0+S_1 \exp(-i\Phi_g))/2$, where $\Phi_g=2\pi f_g\cdot\tau$, and where $W_g'$ is the decomposed water sub-image, $S_0$ is a first reconstructed image acquired with an echo time (TE)=$n\tau$, $S_1$ is a second reconstructed image acquired with a TE=$(n+1)\tau$, n is a positive integer, and $\tau$ is the time during which fat spins precess 180° degrees out of phase with respect to water spins.

8. The apparatus of claim 6, where the water-fat signal decomposition logic produces the decomposed fat sub-image according to:

$F_g'=(S_0-S_1 \exp(-i\phi_g))/2$, where $\phi_g=2\pi f_g\cdot\tau$, and where $F_g'$ is the decomposed fat sub-images, $S_0$ is a first reconstructed image acquired with an echo time (TE)=$n\tau$, $S_1$ is a second reconstructed image acquired with a TE=$(n+1)\tau$, n is a positive integer, and $\tau$ is the time during which fat spins precess 180° degrees out of phase with respect to water spins.

9. The apparatus of claim 6, where the water-fat signal decomposition logic comprises a water signal decomposition logic and a fat signal decomposition logic.

10. The apparatus of claim 6, where the frequency demodulation logic is configured to produce the de-blurred water sub-image by performing a 2D Fourier transform on the decomposed water sub-image to produce a Fourier water data, by frequency demodulating the Fourier water data to produce a demodulated water data, and by performing a 2D inverse Fourier transform on the demodulated water data to produce the de-blurred water sub-image.

11. The apparatus of claim 6, where the frequency demodulation logic is configured to produce the de-blurred fat sub-image by performing a 2D Fourier transform on the decomposed fat sub-image to produce a Fourier fat data, by frequency demodulating the Fourier fat data to produce a demodulated fat data, and by performing a 2D inverse Fourier transform on the demodulated fat data to produce the de-blurred fat sub-image.

12. The apparatus of claim 6, where the frequency estimation logic produces the estimate of the local $B_0$ off-resonance frequency according to:

$f_e=f_g-f_d$, where $$f_d = \frac{\tan^{-1}\left(\frac{\text{Im}(T_{gc})}{\text{Re}(T_{gc})}\right)}{2\pi\cdot\tau}, \text{ and}$$

$$T_{gc} = \left(\frac{W_{gc}+F_{gc}}{W_{gc}-F_{gc}}\right), \text{ where}$$

$f_e$ represents the estimated frequency,
$f_g$ represents the guess frequency,
$f_d$ represents an estimate of a difference between an original guess frequency and a true local off-resonance frequency,
$\tau$ represents the time during which fat spins precess 180° out of phase with respect to water spins,
$T_{gc}$ represents a function of $W_{gc}$ and $F_{gc}$,
Im( ) represents the imaginary part of the quantities within the parentheses,
Re( ) represents the real part of the quantities within the parentheses,
$W_{gc}$ represents a central matrix extracted from the de-blurred water sub-image, and
$F_{gc}$ represents a central matrix extracted from the de-blurred fat sub-image.

13. The apparatus of claim 6, where the guess frequency is computed as the mean of a set of estimated frequencies in the initial estimated $B_0$ off-resonance frequency field map.

14. The apparatus of claim 6, including a water sub-image logic configured to receive the first sub-images and to produce a water sub-image from the first sub-images based, at least in part, on an estimated frequency associated with the final estimated $B_0$ off-resonance frequency field map, where to frequency demodulation logic is further configured to receive the water sub-image and to produce a de-blurred water sub-image based, at least in part, on the estimated frequency associated with the final $B_0$ off-resonance estimated frequency field map, and where the central matrix extraction logic is further configured to extract a portion of the de-blurred water sub-image and to insert the portion in a de-blurred reconstructed water image.

15. The apparatus of claim 14, where the water sub-image logic produces the water sub-image according to:

$W=(S_0+S_1 \exp(-i\phi_g))/2$, where $\phi_g=2\pi \bar{f}_g \cdot \tau$, and where $S_0$ is a first reconstructed image acquired with an echo time (TE)=$n\tau$, $S_1$ is a second reconstructed image acquired with a TE=$(n+1)\tau$, n is a positive integer, $\tau$ is the time during which fat spins precess 180° degrees out of phase wit respect to water spins, and $\bar{f}_e$ is the mean of a set of estimated frequencies in the final estimated $B_0$ off-resonance frequency field map.

16. The apparatus of claim 15, where the frequency demodulation logic produces the de-blurred water sub-image by performing a 2D Fourier transform on the water sub-image to obtain a water sub-image Fourier data, by frequency demodulating the water sub-image Fourier data based, at least in part, on the estimated frequency associated with the final estimated $B_0$ off-resonance frequency field map to produce a water sub-image demodulated data, and by performing a 2D inverse Fourier transform on the water sub-image demodulated data.

17. A system, comprising:

means for acquiring a reconstructed MRI image of an object located in a $B_0$ field; and means for producing an estimated $B_0$ off-resonance frequency field map related to the $B_0$ field present when the MRI image was acquired, where the $B_0$ off-resonance frequency field map is produced, at least in part, using a BRORC-S2PD technique without performing multi-frequency testing.

* * * * *